United States Patent
Lunt, III et al.

(10) Patent No.: US 12,247,126 B2
(45) Date of Patent: Mar. 11, 2025

(54) NEAR-INFRARED HARVESTING TRANSPARENT LUMINESCENT SOLAR CONCENTRATORS WITH ENGINEERED STOKES SHIFT

(71) Applicant: Board of Trustees of Michigan State University, East Lansing, MI (US)

(72) Inventors: Richard R. Lunt, III, Williamston, MI (US); Babak Borhan, Okemos, MI (US); Benjamin G. Levine, East Lansing, MI (US); Wei Sheng, Ann Arbor, MI (US); Jun Zhang, San Luis Obispo, CA (US); Chenchen Yang, Holt, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 865 days.

(21) Appl. No.: 17/053,493

(22) PCT Filed: May 8, 2019

(86) PCT No.: PCT/US2019/031371
§ 371 (c)(1),
(2) Date: Nov. 6, 2020

(87) PCT Pub. No.: WO2019/217583
PCT Pub. Date: Nov. 14, 2019

(65) Prior Publication Data
US 2021/0230427 A1    Jul. 29, 2021

Related U.S. Application Data

(60) Provisional application No. 62/669,184, filed on May 9, 2018.

(51) Int. Cl.
C09B 23/01 (2006.01)
C09K 11/06 (2006.01)
H01L 31/055 (2014.01)

(52) U.S. Cl.
CPC ...... *C09B 23/0041* (2013.01); *C09B 23/0025* (2013.01); *C09B 23/0033* (2013.01);
(Continued)

(58) Field of Classification Search
None
See application file for complete search history.

(56) References Cited

U.S. PATENT DOCUMENTS 4,155,371 A   5/1979 Wohlmut et al.
4,159,212 A   6/1979 Yerkes
(Continued)

FOREIGN PATENT DOCUMENTS

CN   101107258 A   1/2008
CN   103534831 A   1/2014
(Continued)

OTHER PUBLICATIONS

"IR 144", Exciton [retrieved from chrome-extension://efaidnbmnnnibpcajpcglclefindmkaj/https://www.photonicsolutions.co.uk/upfiles/IR-144.pdf on Aug. 15, 2023] (Year: 2023).*
(Continued)

*Primary Examiner* — Ryan S Cannon
(74) *Attorney, Agent, or Firm* — Harness, Dickey & Pierce, PLC

(57) ABSTRACT

A luminescent solar concentrator (LSC) device is provided. The LSC device has an active layer including a modified luminophore having a polymethine component including a plurality of methine groups (=CH—)$_n$, where n is an odd integer greater than 1. A hydrogen atom (H) of one of the plurality of methine groups is replaced by one of -AR$_1$R$_2$ or
(Continued)

-DR$_3$, where A is selected from nitrogen (N), phosphorus (P), arsenic (As) and antimony (Sb) and D is selected from oxygen (O), sulfur (S), selenium (Se), and tellurium (Te), R$_1$ and R$_2$ are independently selected from H, aliphatic groups, and aromatic groups bound to A through a carbon atom, or R$_1$ and R$_2$ together form an alicyclic ring containing A, and R$_3$ is selected from H, aliphatic groups, aromatic groups, and alicyclic groups bound to D through a carbon atom.

18 Claims, 10 Drawing Sheets

(52) U.S. Cl.
CPC .......... C09B 23/0066 (2013.01); C09K 11/06 (2013.01); H01L 31/055 (2013.01); C09K 2211/1022 (2013.01)

(56) References Cited

U.S. PATENT DOCUMENTS

| | | | |
|---|---|---|---|
| 4,293,732 | A | 10/1981 | Rancourt et al. |
| 4,357,486 | A | 11/1982 | Blieden et al. |
| 4,994,396 | A | 2/1991 | Lefkowitz et al. |
| 5,877,874 | A | 3/1999 | Rosenberg |
| 6,113,718 | A | 9/2000 | Yamada et al. |
| 6,238,931 | B1 | 5/2001 | Buechler et al. |
| 6,288,326 | B1 | 9/2001 | Hayashi et al. |
| 6,399,392 | B1 | 6/2002 | Haugland et al. |
| 7,745,724 | B2 | 6/2010 | Balasubramanian et al. |
| 8,237,048 | B2 | 8/2012 | Kawano et al. |
| 8,558,108 | B2 | 10/2013 | Kitazawa et al. |
| 8,864,886 | B2 | 10/2014 | Bonucci et al. |
| 10,439,090 | B2 | 10/2019 | Lunt et al. |
| 10,510,914 | B2 | 12/2019 | Lunt et al. |
| 11,114,623 | B2 | 9/2021 | Lunt et al. |
| 2002/0189666 | A1 | 12/2002 | Forrest et al. |
| 2003/0095924 | A1* | 5/2003 | Licha ............... A61K 49/0052 424/9.6 |
| 2003/0227517 | A1 | 12/2003 | Yaron |
| 2006/0011233 | A1 | 1/2006 | Sariftci et al. |
| 2006/0051758 | A1 | 3/2006 | Mujumdar et al. |
| 2006/0112983 | A1 | 6/2006 | Parce et al. |
| 2007/0116628 | A1 | 5/2007 | Shew et al. |
| 2007/0140962 | A1 | 6/2007 | Achilefu et al. |
| 2007/0297988 | A1 | 12/2007 | Wu |
| 2008/0072960 | A1 | 3/2008 | Kim et al. |
| 2009/0027872 | A1 | 1/2009 | Debije et al. |
| 2009/0029405 | A1* | 1/2009 | Pham ............... C07D 403/14 530/402 |
| 2009/0032083 | A1 | 2/2009 | Torrance et al. |
| 2009/0056791 | A1 | 3/2009 | Pfenninger et al. |
| 2009/0159801 | A1 | 6/2009 | Knapp et al. |
| 2009/0229652 | A1 | 9/2009 | Mapel et al. |
| 2009/0235988 | A1 | 9/2009 | Jenekhe et al. |
| 2009/0272426 | A1* | 11/2009 | Winscom ............... H01L 31/055 136/247 |
| 2010/0276638 | A1 | 11/2010 | Liu et al. |
| 2010/0285515 | A1 | 11/2010 | Nagano et al. |
| 2010/0288352 | A1 | 11/2010 | Ji et al. |
| 2010/0326496 | A1 | 12/2010 | Bhattacharya et al. |
| 2011/0063392 | A1 | 3/2011 | Wu et al. |
| 2011/0086302 | A1 | 4/2011 | Zhou et al. |
| 2011/0108773 | A1 | 5/2011 | Gore |
| 2011/0114174 | A1* | 5/2011 | Rennig ............... H10K 30/87 136/257 |
| 2011/0220194 | A1 | 9/2011 | Kurtin et al. |
| 2011/0232211 | A1 | 9/2011 | Farahi |
| 2011/0240120 | A1 | 10/2011 | Ronda et al. |
| 2012/0123109 | A1 | 5/2012 | Diwu et al. |
| 2012/0186623 | A1 | 7/2012 | Bulovic et al. |
| 2012/0279566 | A1 | 11/2012 | Bruder et al. |
| 2012/0302881 | A1 | 11/2012 | Teranishi et al. |
| 2013/0092887 | A1 | 4/2013 | Seshadri et al. |
| 2013/0104983 | A1 | 5/2013 | Abrams et al. |
| 2013/0174896 | A1 | 7/2013 | Ardo et al. |
| 2013/0230464 | A1 | 9/2013 | Yi et al. |
| 2013/0240027 | A1 | 9/2013 | Zakhidov et al. |
| 2013/0333755 | A1 | 12/2013 | Lunt et al. |
| 2014/0018425 | A1 | 1/2014 | Hsu et al. |
| 2014/0130864 | A1 | 5/2014 | Lunt et al. |
| 2014/0148425 | A1 | 5/2014 | Bonnet |
| 2014/0283896 | A1 | 9/2014 | Lunt, III et al. |
| 2016/0013433 | A1 | 1/2016 | Yang et al. |
| 2016/0141535 | A1 | 5/2016 | Snaith et al. |
| 2017/0044340 | A1 | 2/2017 | Farah et al. |
| 2018/0243442 | A1 | 8/2018 | Lam et al. |

FOREIGN PATENT DOCUMENTS

| | | |
|---|---|---|
| CN | 103606633 A | 2/2014 |
| CN | 104272485 A | 1/2015 |
| EP | 2693503 A1 | 2/2014 |
| JP | 2000-208800 | 7/2000 |
| JP | 2001076877 A | 3/2001 |
| JP | 2002108259 A | 4/2002 |
| JP | 2003269317 A | 9/2003 |
| JP | 2004252304 A | 9/2004 |
| JP | 2005503453 A | 2/2005 |
| JP | 2005116367 A | 4/2005 |
| JP | 2005-136531 A | 5/2005 |
| JP | 2008-528706 A | 7/2008 |
| JP | 2009512122 A | 3/2009 |
| JP | 4258656 B2 | 4/2009 |
| JP | 2010258020 A | 11/2010 |
| JP | 2011505479 A | 2/2011 |
| JP | 2012510717 A | 5/2012 |
| JP | 2012-186130 | 9/2012 |
| JP | 2012532135 A | 12/2012 |
| JP | 2013506278 A | 2/2013 |
| JP | 2013109076 A | 6/2013 |
| JP | 2013526008 A | 6/2013 |
| JP | 2013529372 A | 7/2013 |
| JP | 2013-187349 | 9/2013 |
| JP | 2013535799 A | 9/2013 |
| JP | 2014505370 A | 2/2014 |
| JP | 2014049631 A | 3/2014 |
| JP | 2015032606 A | 2/2015 |
| TW | 201115763 A | 5/2011 |
| WO | WO-2004-084272 A2 | 9/2004 |
| WO | WO-2006-073562 A2 | 7/2006 |
| WO | WO-2006-082945 A2 | 8/2006 |
| WO | WO-2007-035466 A2 | 3/2007 |
| WO | WO-2009-002943 A2 | 12/2008 |
| WO | WO-2009-011188 A1 | 1/2009 |
| WO | WO-2009-091773 A2 | 7/2009 |
| WO | WO-2011-074295 A1 | 6/2011 |
| WO | WO-2011-158568 A1 | 12/2011 |
| WO | WO-2012-061724 A2 | 5/2012 |
| WO | WO-2012-063964 A1 | 5/2012 |
| WO | WO-2013-003890 A1 | 1/2013 |
| WO | WO-2013-003894 A1 | 1/2013 |
| WO | WO-2013-102985 A1 | 7/2013 |
| WO | WO-2013-167224 A1 | 11/2013 |
| WO | WO-2013-171517 A1 | 11/2013 |
| WO | WO-2014-151522 A1 | 9/2014 |
| WO | WO-2016-151535 | 9/2016 |

OTHER PUBLICATIONS

S. K. Yen et al., "Design and synthesis of polymer-functionalized NIR fluorescent dyes—Magnetic nanoparticles for bioimaging", ACS Nano 7(8) p. 6796-6805 (Year: 2013).*
C. Yang et al., "Impact of stokes shift on the performance of near-infrared harvesting transparent luminescent solar concentrators", Nature Scientific Reports 8, 16359 (Year: 2018).*
S. H. Nabavi, et al., "Excited states study reveals the twisted geometry induced large stokes shift in DCM fluorescent dye", Journal of Photochemistry and Photobiology A: Chemistry 354, p. 127-138 (Year: 2018).*
Supporting information for "Impact of stokes shift on the performance of near-infrared harvesting transparent luminescent solar

(56) References Cited

OTHER PUBLICATIONS concentrators" [retrieved from https://www.nature.com/articles/s41598-018-34442-3#Sec8 on Jun. 12, 2024] (Year: 2018).*
W. Holzer, A. Penzkofer, T. Tsuboi, "Absorption and emission spectroscopic characterization of Ir(ppy)3", Chemical Physics 308, p. 93-102 (Year: 2005).*
Abdi-Jalebi, M. et al., "Impact of Monovalent Cation Halide Additives on the Structural and Optoelectronic Properties of $CH_3NH_3PbI_3$ Perovskite," Adv. Energy Mater., p. 1502472 (2016).
Barnham, Keith et al., "Quantum-dot concentrator and thermodynamic model for the global redshift," Applied Physics Letters, vol. 76, No. 9, pp. 1197-1199 (2000).
Batchelder, J. S. et al., "Luminescent solar concentrators. 1: Theory of operation and techniques for performance evaluation," Applied Optics, vol. 18, No. 18, pp. 3090-3110 (1979).
Batchelder, J. S. et al., "Luminescent solar concentrators. 2: Experimental and theoretical analysis of their possible efficiencies," Applied Optics, vol. 20, No. 21, pp. 3733-3754 (1981).
Bates, M. and Lunt, R. R., "Organic salt photovoltaics," Sustainable Energy & Fuels (2017).
Bertolino, Chiara A. et al., "Novel Heptamethine Cyanine Dyes with Large Stokes' Shift for Biological Applications in the Near Infrared," Journal of Fluorescence, vol. 16, No. 2, pp. 221-225 (2006).
Bos, Francis, "Optimization of spectral coverage in an eight-cell oscillator-amplifier dye laser pumped at 308 nm," Applied Optics, vol. 20, No. 20, pp. 3553-3556 (1981).
Bouit, P.A. et al., "Continuous Symmetry Breaking Induced by Ion Pairing Effect in Heptamethine Cyanine Dyes: Beyond the Cyanine Limit," J. Am. Chem. Soc., vol. 132, pp. 4328-4335 (2010).
Brabec, C.J. et al., "Organic photovoltaic devices produced from conjugated polymer/methanofullerene bulk heterojunctions," Synthetic Metals, vol. 121, No. 1-3, pp. 1517-1520 (2001).
Bryant, D. et al., "Observable Hysteresis at Low Temperature in 'Hysteresis Free' Organic-Inorganic Lead Halide Perovskite Solar Cells," J. Phys. Chem. Lett., vol. 6, pp. 3190-3194 (2015).
Casida, Mark E. et al., "Molecular excitation energies to high-lying bound states from time-dependent density-functional response theory: Characterization and correction of the time-dependent local density approximation ionization threshold," Journal of Chemical Physics, vol. 108, No. 11, pp. 4439-4449 (1998).
Chatten, A. J. et al., "A new approach to modelling quantum dot concentrators," Solar Energy Materials and Solar Cells, vol. 75, No. 3-4, pp. 363-371 (2003).
Chen et al. "Controllable Self-Induced Passivation of Hybrid Lead Iodide Perovskites Toward High Performance Solar Cells," Nano Lett., 14, 4158-4163 (2014).
Chen, Chun-Chao et al., "Visibly Transparent Polymer Solar Cells Produced by Solution Processing," ACS Nano, vol. 6, No. 8, pp. 7185-7190 (2012).
Chirila, A. et al., "Potassium-Induced Surface Modification of $Cu(In,Ga)Se_2$ Thin Films for High-Efficiency Solar Cells," Nat. Mater., vol. 12, pp. 1107-1111 (2013).
Cojocaru-Miredin, O. et al., "Characterization of Grain Boundaries in $Cu(In,Ga)Se_2$ Films Using Atom-Probe Tomography," IEEE J. Photovoltaics, vol. 1, pp. 207-212 (2011).
Currie, Michael J. et al., "High-Efficiency Organic Solar Concentrators for Photovoltaics," Science, vol. 321, No. 5886, pp. 226-228 (2008).
De Jonghe-Risse, J. et al., "Ultrafast charge transfer in solid-state films of pristine cyanine borate and blends with fullerene," Journal of Materials Chemistry A, vol. 3, pp. 10935-10941 (2015).
Debije, Michael G. et al., "Thirty Years of Luminescent Solar Concentrator Research: Solar Energy for the Built Environment," Advanced Energy Materials, vol. 2, pp. 12-35 (2012).
Decker, C. David, "Excited state absorption and laser emission from infrared laser dyes optically pumped at 532 nm," Applied Physics Letters, vol. 27, No. 11, pp. 607-609 (1975).

Dunning Jr., Thom H., "Gaussian basis sets for use in correlated molecular calculations. I. The atoms boron through neon and hydrogen," Journal of Chemical Physics, vol. 90, No. 2, pp. 1007-1023 (1989).
Erslev, P. et al., "The Influence of Na on Metastable Defect Kinetics in CIGS Materials," Thin Solid Films, vol. 517, pp. 2277-2281 (2009).
Escobedo, Jorge O. et al., "NIR dyes for bioimaging applications," Current Opinion in Chemical Biology, vol. 14, pp. 64-70 (2010).
Exciton, LDS 730, retrieved from: www.exciton.com/pdfs/lds730.pdf.
Faist, Mark A., "Competition between the charge transfer state and the singlet states of donor or acceptor limiting the efficiency in polymer: fullerene solar cells," Journal of the American Chemical Society, vol. 134, No. 1, pp. 685-692 (2012).
Fan, B. et al., "High performing doped cyanine bilayer solar cell," Organic Electronics, vol. 11, pp. 583-588 (2010).
Fischer, Georg M. et al., "Pyrrolopyrrole Cyanine Dyes: A New Class of Near-Infrared Dyes and Fluorophores," Chemistry—A European Journal, vol. 15, No. 19, pp. 4857-4864 (2009).
Galluzzi, F. et al., "Spectrum shifting of sunlight by luminescent sheets: Performance evaluation of photovoltaic applications," Solar Energy, vol. 33, No. 6, pp. 501-507 (1984).
Gao, Dangli et al., "Codopant ion-induced tunable up conversion emission in $\beta$-$NaYF_4$:$Yb^{3+}$/$Tm^{3+}$ nanorods," Dalton Transactions, vol. 42, No. 5, pp. 1834-1841 (2013).
Goetzberger, A. et al., "Solar Energy Conversion with Fluorescent Collectors," Applied Physics, vol. 14, pp. 123-139 (1977).
Goldschmidt, Jan Christoph et al., "Increasing the efficiency of fluorescent concentrator systems," Solar Energy Materials and Solar Cells, vol. 93, No. 2, pp. 176-182 (2009).
Gross, E. K. U. et al., "Local Density-Functional Theory of Frequency-Dependent Linear Response," Physical Review Letters, vol. 55, No. 26, pp. 2850-2852 (1985).
Hany, R. et al., "Strategies to improve cyanine dye multi layer organic solar cells," Progress in Photovoltaics: Research and Applications, vol. 19, No. 7, pp. 851-857 (2011).
Hirata, So et al., "Time-dependent density functional theory within the Tamm-Dancoff approximation," Chemical Physics Letters, vol. 314, No. 3-4, pp. 291-299 (1999).
Iles, P.A., "Non-solar photovoltaic cells," Proceedings of the 21st IEEE Conference on Photovoltaic Specialists, vol. 1, pp. 420-425 (1990).
Jacquemin, Denis et al., "Assessment of the efficiency of long-range corrected functionals for some properties of large compounds." Journal of Chemical Physics, vol. 126, No. 14, pp. 144105-1-144105-12 (2007).
Kirakci, Kaplan et al., "A Highly Luminescent Hexanuclear Molybdenum Cluster—A Promising Candidate toward Photoactive Materials," European Journal of Inorganic Chemistry, pp. 3107-3111 (2012).
Kirchartz, Thomas et al., "Efficiency Limits of Organic Bulk Heterojunction Solar Cells," The Journal of Physical Chemistry C, vol. 113, No. 41, pp. 17958-17966 (2009).
Knorr, Fritz J. et al., "Investigation of Solvent Isotope Effects on Raman and Fluorescence Intensity of LDS750 in $CH_3OH$ and $CD_3OD$," Journal of Physical Chemistry A, vol. 104, No. 42, pp. 9494-9499 (2000).
Kohn, W. et al., "Self-Consistent Equations Including Exchange and Correlation Effects," Physical Review, vol. 140, No. 4A, pp. A1133-A1138 (1965).
Kowalski, Karol et al., "New coupled-cluster methods with singles, doubles, and noniterative triples for high accuracy calculations of excited electronic states," Journal of Chemical Physics, vol. 120, No. 4, pp. 1715-1738 (2004).
Laemmle, A. et al., "Investigation of the Diffusion Behavior of Sodium in $Cu(In,Ga)Se_2$ Layers," J. Appl. Phys., vol. 114, p. 154501 (2014).
Lunt, R. et al., "Practical Roadmap and Limits to Nanostructured Photovoltaics" (Perspective), Adv. Mat. 23, pp. 5712-5727 (2011).
Lunt, Richard R. et al., "Theoretical limits for visibly transparent photovoltaics," Applied Physics Letters, vol. 101, pp. 043902-043902-4 (2012).

(56) References Cited

OTHER PUBLICATIONS

Lunt, Richard R. et al., "Transparent, near-infrared organic photovoltaic solar cells for window and energy-scavenging applications," Applied Physics Letters, vol. 98, No. 11, pp. 113305-1-113305-3 (2011).
Cao, Duyen H., et al., "Remnant PcI2, an unforeseen necessity in high-efficiency hybrid perovskite-based solar cells?" Applied Physics Letters 103, 183906 (2013), https://doi.org/10.1063/1.4826116.
Malinkiewicz, O. et al., "Efficient, Cyanine Dye Based Bilayer Solar Cells." Adv. Energy Mater., vol. 3, pp. 472-477 (2013).
Martin, Richard L., "Natural transition orbitals," Journal of Chemical Physics, vol. 118, No. 11, pp. 4775-4777 (2003).
Moore, C. A. et al., "Power-scaling effects in dye lasers under high-power laser excitation," Journal of Applied Physics, vol. 49, No. 1, pp. 47-60 (1978).
Osborn et al., "Mo6Cl12-incorporated sol-gel for oxygen sensing applications" (Jun. 2005).
Ostrowski, Jacek C. et al., "Near-Infrared Electroluminescent Light-Emitting Devices Based on Ethyne-Bridged Porphyrin Fluorophores," Advanced Materials, vol. 15, No. 15, pp. 1296-1300 (2003).
Pansare, Vikram J. et al., "Review of Long-Wavelength Optical and NIR Imaging Materials: Contrast Agents, Fluorophores, and Multifunctional Nano Carriers," Chemistry of Materials, vol. 24, No. 5, pp. 812-827 (2012).
Peng, Xiaojun et al., "Heptamethine Cyanine Dyes with a Large Stokes Shift and Strong Fluorescence: A Paradigm for Excited-State Intramolecular Charge Transfer," Journal of the American Chemical Society, vol. 127, No. 12, pp. 4170-4171 (2005).
Philip, R. et al., "Absorption and fluorescence spectroscopic investigation of indocyanine green," Journal of Photochemistry and Photobiology A: Chemistry, vol. 96, No. 1-3, pp. 137-148 (1996).
Piecuch, Piotr et al., "Efficient computer implementation of the renormalized coupled-cluster methods: The R-CCSD[T], R-CCSD(T), CR-CCSD[T], and CR-CCSD(T) approaches," Computer Physics Communications, vol. 149, No. 2, pp. 71-96 (2002).
Qian, Chao et al., "Synthesis and Down conversion Emission Property of $Yb_2O_3$:$Eu^{3+}$ Nanosheets and Nanotubes," Advances in Condensed Matter Physics, vol. 2013, No. 519869, pp. 1-5 (2013).
Qin, C. et al., "Novel Near-Infrared Squaraine Sensitizers for Stable and Efficient Dye-Sensitized Solar Cells," Advanced Functional Materials, vol. 24, pp. 3059-3066 (2014).
Rand, B. P. et al., "Offset energies at organic semiconductor heterojunctions and their influence on the open-circuit voltage of thin-film solar cells," Physical Review B, vol. 75, No. 11, pp. 115327-1-115327-11 (2007).
Reigue, Antoine et al., "CW measurements of resonance Raman profiles, line-widths, and cross-sections of fluorescent dyes: application to Nile Blue A in water and ethanol," Journal of Raman Spectroscopy, vol. 44, No. 4, pp. 573-581 (2013).
Reisfeld, Renata et al., "Planar solar energy convertor and concentrator based on uranyl-doped glass," Nature, vol. 274, No. 5667, pp. 144-145 (1978).
Rowan, Brenda C. et al., "Advanced Material Concepts for Luminescent Solar Concentrators," IEEE Journal of Selected Topics in Quantum Electronics, vol. 14, No. 5, pp. 1312-1322 (2008).
Ruckh, M. et al., "Influence of Substrates on the Electrical Properties of Cu(In,Ga)$Se_2$ Thin Films," Sol. Energy Mater. Sol. Cells, vol. 41-42, pp. 335-343 (1996).
Rudmann, D. et al., "Effects of NaF Co-evaporation on Structural Properties of Cu(In,Ga)$Se_2$ Thin Films," Thin Solid Films, pp. 431-432, 37-40 (2003).
Rurack, Knut et al., "Fluorescence Quantum Yields of a Series of Red and Near-Infrared Dyes Emitting at 600-1000 nm," Analytical Chemistry, vol. 83, No. 4, pp. 1232-1242 (2011).
Schmidt, Michael W. et al., "General atomic and molecular electronic structure system," Journal of Computational Chemistry, vol. 14, No. 11, pp. 1347-1363 (1993).
Shaheen, Sean E. et al., "2.5% efficient organic plastic solar cells," Applied Physics Letters, vol. 78, No. 6, pp. 841-843 (2001).
Shao, Yihan et al., "Advances in methods and algorithms in a modern quantum chemistry program package," Physical Chemistry Chemical Physics, vol. 8, No. 27, pp. 3172-3191 (2006).
Shcherbatyuk, G. V. et al., "Viability of using near infrared PbS quantum dots as active materials in luminescent solar concentrators," Applied Physics Letters, vol. 96, No. 19, pp. 191901-1-191901-3 (2010).
Sheng, Xing et al., "Doubling the Power Output of Bifacial Thin-Film GaAs Solar Cells by Embedding Them in Luminescent Waveguides," Advanced Energy Materials, vol. 3, No. 8, pp. 991-996 (2013).
Sholin, V. et al., "Semiconducting polymers and quantum dots in luminescent solar concentrators for solar energy harvesting," Journal of Applied Physics, vol. 101, No. 12, pp. 123114-1-123114-9 (2007).
Shrotriya, Vishal et al., "Accurate Measurement and Characterization of Organic Solar Cells," Advanced Functional Materials, vol. 16, No. 15, pp. 2016-2023 (2006).
Slooff, L.H. et al., "A luminescent solar concentrator with 7.1% power conversion efficiency," Physica Status Solidi—Rapid Research Letters, vol. 2, No. 6, pp. 257-259 (2008).
Smestad, G. et al., "The thermodynamic limits of light concentrators," Solar Energy Materials, vol. 21, No. 2-3, pp. 99-111 (1990).
Smestad, Greg et al., "Testing of dye sensitized $TiO_2$ solar cells I: Experimental photocurrent output and conversion efficiencies," Solar Energy Materials and Solar Cells, vol. 32, No. 3, pp. 259-272 (1994).
Soni, Abhishek Kumar et al., "Host-Sensitized Continuum-Broad-Band White-Light Emitting $Yb_2O_3$:$Er^{3+}$ Phosphor under CW-NIR Light Absorption," Chemistry Select, vol. 4, No. 12, pp. 3408-3415 (2019).
Stanton, John F. et al., "The equation of motion coupled-cluster method. A systematic biorthogonal approach to molecular excitation energies, transition probabilities, and excited state properties," Journal of Chemical Physics, vol. 98, No. 9, pp. 7029-7039 (1993).
Szczepura et al., "Synthesis and study of Hexanuclear Molybdenum clusters containing thiolate ligands" (Jul. 2008), Inorganic Chemistry, 47, 7271-7278.
Van Sark, Wilfried G.J.H.M. et al., "Luminescent Solar Concentrators—A review of recent results," vol. 16, No. 26, pp. 21773-21792 (2008).
Vandewal, Koen et al., "On the origin of the open-circuit voltage of polymer-fullerene solar cells," Nature Materials, vol. 8, No. 11, pp. 904-909 (2009).
Veron, A.C. et al., "NIR-Absorbing Heptamethine Dyes with Tailor-Made Counterions for Application in Light to Energy Conversion," Org. Lett., vol. 16, pp. 1044-1047 (2014).
Wang, Tongxin et al., "Luminescent solar concentrator employing rare earth complex with zero self-absorption loss," Solar Energy, vol. 85, No. 11, pp. 2571-2579 (2011).
Wang, Y. et al., "Dye Sensitization in the Visible Region for Low-Bandgap Polymer Solar Cells," Journal of the Electrochemical Society, vol. 161, No. 7, pp. D3093-D3096 (2014).
Watt's Dictionary of Chemistry, vol. 3, p. 428 (1892).
Weber, W. H. et al., "Luminescent greenhouse collector for solar radiation," Applied Optics, vol. 15, No. 10, pp. 2299-2300 (1976).
Weissleder, Ralph, "A clearer vision for in vivo imaging," Nature Biotechnology, vol. 19, No. 4, pp. 316-317 (2001).
Werts, Martinus H.V. et al., "Fluorescein and eosin as sensitizing chromophores in near-infrared luminescent ytterbium(III), neodymium(III) and erbium(III) chelates," Chemical Physics Letters, vol. 276, No. 3-4, pp. 196-201 (1997).
Wicht, G. et al., "Stability of bilayer trimethine cyanine dye/fullerene organic solar cells," Solar Energy Materials and Solar Cells, vol. 117, pp. 585-591 (2013).
Wittwer, V. et al., "Fluorescent planar concentrators," Solar Energy Materials, vol. 11, No. 3, pp. 187-197 (1984).
Wloch, Marta et al., "Extension of renormalized coupled-cluster methods including triple excitations to excited electronic states of open-shell molecules," Journal of Chemical Physics, vol. 122, No. 21, pp. 214107-1-214107-15 (2005).

(56) References Cited

OTHER PUBLICATIONS

Yanai, Takeshi et al., "A new hybrid exchange-correlation functional using the Coulomb-attenuating method (CAM-B3LYP)," Chemical Physics Letters, vol. 393, No. 1-3, pp. 51-57 (2004).
Yin, X. et al., "Highly Efficient Flexible Perovskite Solar Cells Using Solution-Derived $NiO_x$ Hole Contacts," ACS Nano, vol. 10, pp. 3630-3636 (2016).
Yoon, Jongseung et al., "Flexible concentrator photovoltaics based on microscale silicon solar cells embedded in luminescent waveguides," Nature Communications, vol. 2, No. 243 (2011).
Zhang, H. et al., "Semitransparent organic photovoltaics using a near-infrared absorbing cyanine dye," Solar Energy Materials and Solar Cells, vol. 118, pp. 157-164 (2013).
Zhao, Y., Transparent Luminescent Solar Concentrators; retrieved from internet<URL:https://d.lib.msu.edu/islandora/object/etd:3722/datastream/QBJ/view>, pp. 1-118 (2015).
Zhao, Yimu et al., "Transparent Luminescent Solar Concentrators for Large-Area Solar Windows Enabled by Massive Stokes-Shift Nanocluster Phosphors," Advanced Energy Materials, vol. 3, No. 9, pp. 1143-1148 (2013).
Zietlow et al. "Photophysics and Electrochemistry of Hexanuclear Tungsten Halide Clusters," Inorganic Chemistry, 25, pp. 1351-1353 (1986).
Hauch, Jens A., et al. "Flexible organic P3HT:PCBM bulk-heterojunction modules with more than 1 year outdoor lifetime," Science Direct, pp. 727-731 (2008).
Verreet, Bregt et al., "Structural templating of chloro-aluminum phthalovyanine layers for planar and bulk heterojunction organic solar cells," Organic Electronics, 12, pp. 2131-2139 (2011).
U.S. Appl. No. 16/697,762, filed Nov. 27, 2019, Lunt et al.
U.S. Appl. No. 17/409,009, filed Aug. 23, 2021, Lunt et al.
U.S. Appl. No. 16/990,786, filed Aug. 11, 2020, Lunt et al.
U.S. Appl. No. 16/765,625, filed May 20, 2020, Lunt et al.
U.S. Appl. No. 16/960,461, filed Jul. 7, 2020, Lunt et al.

\* cited by examiner

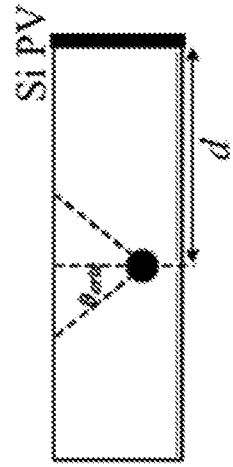
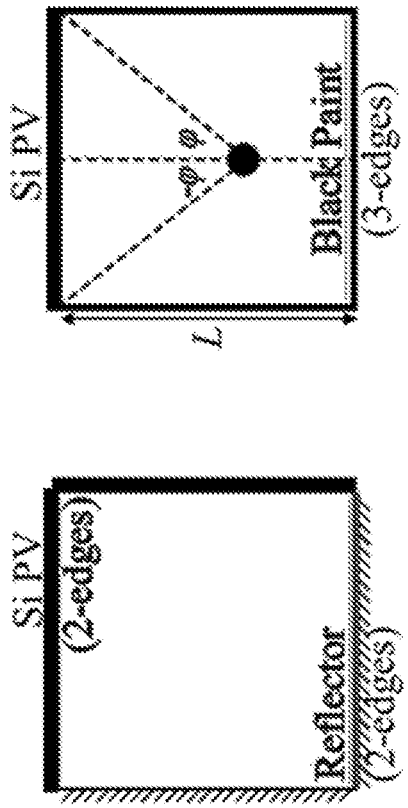
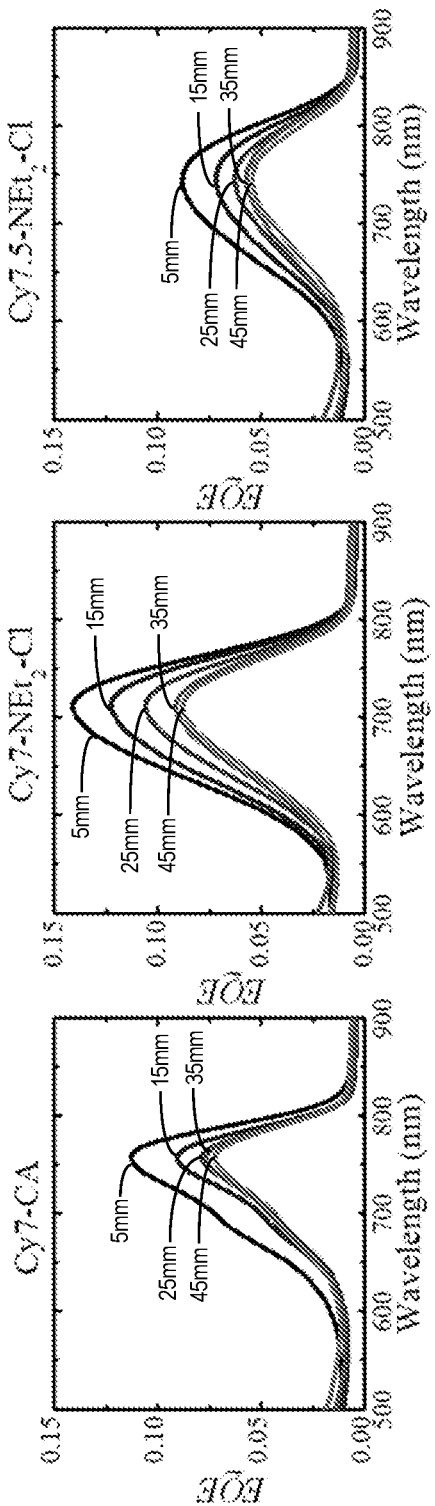
Fig. 3A  Fig. 3B  Fig. 3C
Fig. 3D  Fig. 3E  Fig. 3F

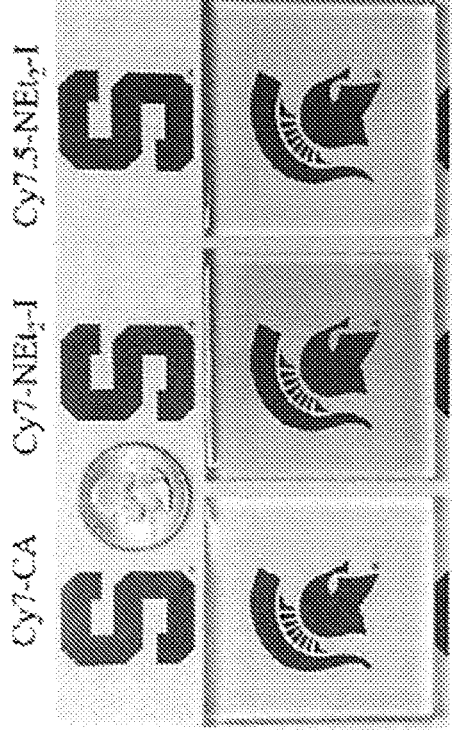
Fig. 5A
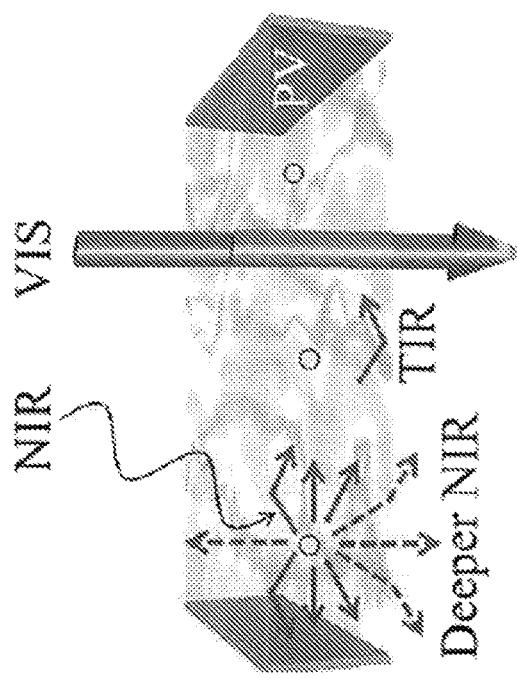
Fig. 5B
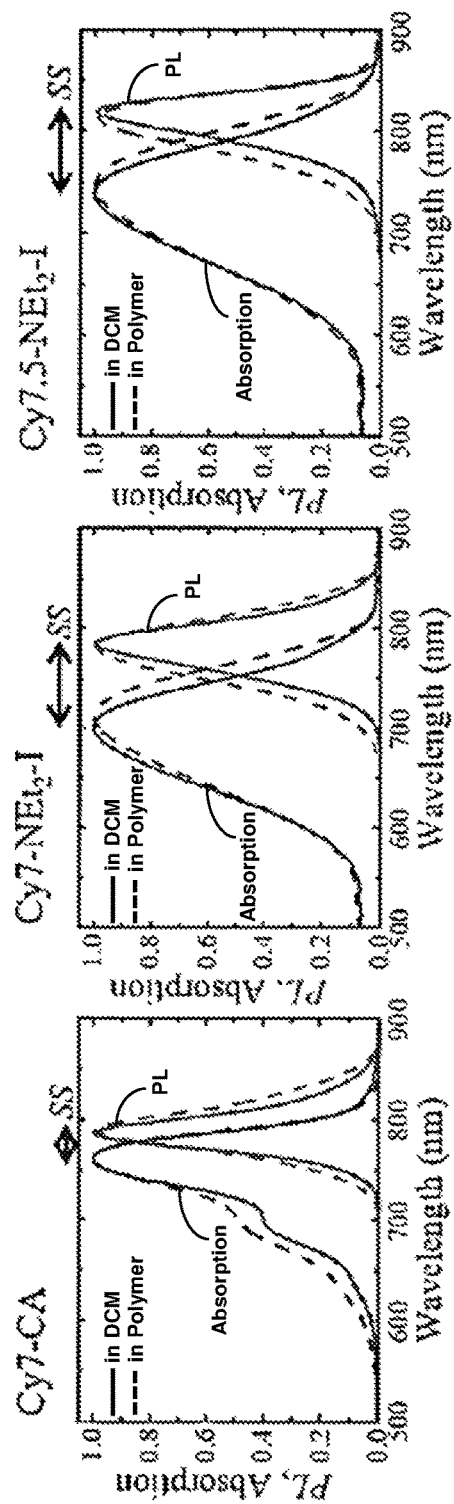
Fig. 5C
Fig. 5D
Fig. 5E

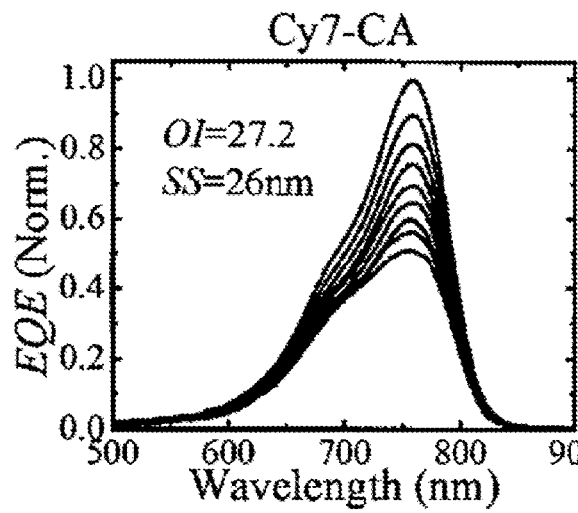
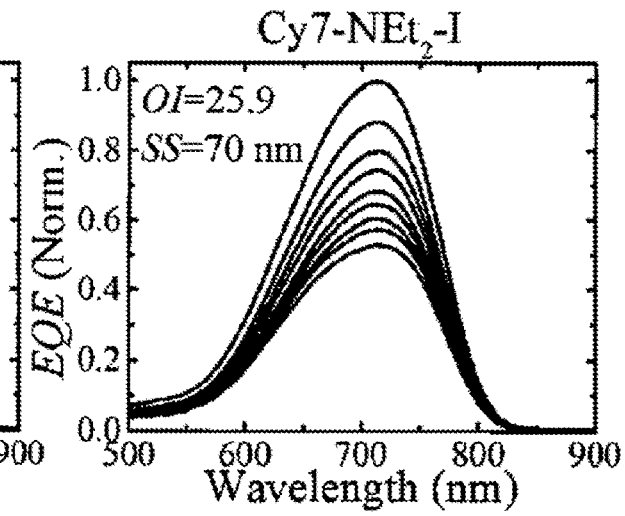
Fig. 8A  Fig. 8B
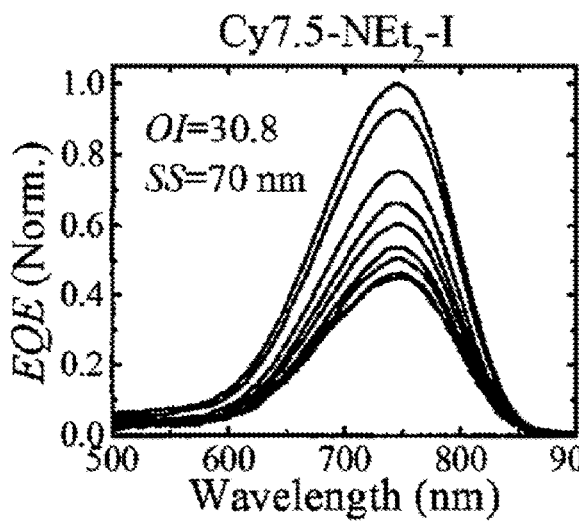
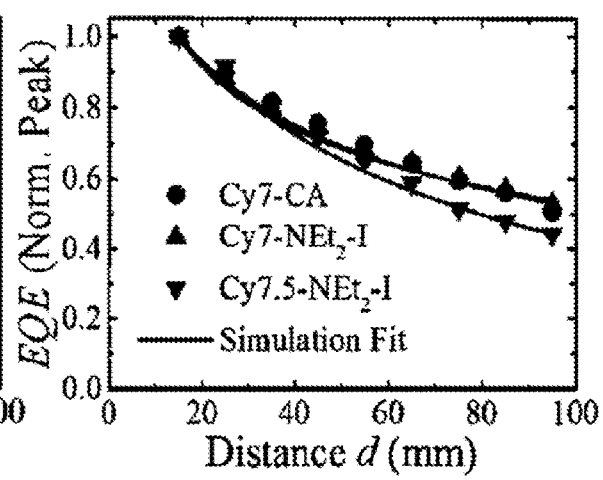
Fig. 8C  Fig. 8D

NEAR-INFRARED HARVESTING TRANSPARENT LUMINESCENT SOLAR CONCENTRATORS WITH ENGINEERED STOKES SHIFT

CROSS-REFERENCE TO RELATED APPLICATIONS

This application is a 371 U.S. National Phase of International Application No. PCT/US2019/031371, filed May 8, 2019, which claims the benefit of U.S. Provisional Application No. 62/669,184, filed on May 9, 2018. The entire disclosures of the above applications are incorporated herein by reference.

GOVERNMENT RIGHTS

This invention was made with government support under 1702591 awarded by the National Science Foundation. The government has certain rights in the invention.

FIELD

The present disclosure relates to near-infrared harvesting transparent luminescent solar concentrators with engineered Stokes shift.

BACKGROUND

This section provides background information related to the present disclosure which is not necessarily prior art.

Seamless installation of transparent luminescent solar concentrator (TLSC) systems onto the architectural envelope transforms passive surfaces into solar energy harvesting resources, dramatically improving energy utilization efficiency without compromising their current functionality and aesthetic quality underneath. However, reabsorption of emitted photons combined with non-unity quantum yield (QY) of the luminophores act as the main loss mechanism that can dramatically limit the power conversion efficiency over larger areas (transparent, colored, or opaque). Reabsorption loss originates from the overlap between the absorption and emission spectra. The Stokes shift (SS), defined as the wavelength difference between the absorption and emission peak maxima for the same transition, is frequently used to quantify and rationalize this loss in luminescent solar concentrators (LSCs).

Recently, several approaches towards mitigating the reabsorption effect by increasing the Stokes shift with various species of luminophores have been reported for quantum dots, rare-earth ions, nanoclusters, and organic molecules. For example, inorganic semiconductor nanocrystals exhibit high photoluminescence efficiencies with absorption and emission spectra that are tunable by particle size and composition. Several strategies have been developed to increase the Stokes shift, including most notably the formation of core/shell "giant" quantum dots (QDs) as quasi-type I or type II hetero-structures for CdSe/CdS, PbS/CdS, I-II-VI$_2$ ternary CdSe/Cd$_x$Pb$_{1-x}$S, CuInS$_2$/CdS, or CuInS$_2$/ZnS QDs. The nanocrystal shell typically has a larger energy bandgap, acting as a photon absorbing antenna and protective carrier barrier when energy is transferred to the lower bandgap core crystal photon emitter. The energy gap difference between the core and the shell crystals results in an increase in downshift up to 150-200 nm. Doping quantum dots with transition metal ions is another approach to tackle the reabsorption problem, for example, utilizing Mn-doped ZnSe, Cu-doped CdSe QDs, or nanoplatelets. The doping impurity introduces new localized excited energy states (mid-gaps) within the original QD energy bandgap, which generates a downshifted radiative recombination with respect to the absorption.

However, a key limitation of these QDs is the continuous band-like absorption profiles that hinder selective absorption of invisible infrared photons without an accompanying absorption in the visible that reduce their transparency and aesthetic quality. In contrast, organic molecules are a class of luminophore candidates for LSC and TLSC applications that exhibit excitonic properties and separated molecular orbitals stemming from their 7π-conjugated molecular structure. While the Stokes shifts of traditional and commercially available organic dyes utilized in LSCs are generally small (less than 20-30 nm), recent efforts have looked to circumvent the reabsorption loss by using an excitation energy transfer (energy migration) strategy with multiple dyes via Forster resonance energy transfer (FRET). Such an approach separates the absorption of the donor from the emission of the acceptor so that the reabsorption in the LSCs is reduced, but the close physical coupling of the dyes along with the need for multiple dyes with high quantum yields creates additional challenges. Another method has also been explored via resonance shifting in optical cavity designs for the waveguides, but it requires the utilization of neat thin-film layers of luminophores, which are often less suitable for achieving the highest luminescent quantum yields.

For many TLSC applications, high aesthetic quality and transparency are the most critical metrics. Thus, harvesting the invisible portion of the solar spectrum (ultraviolet (UV) and near-infrared (NIR)) is most beneficial for such applications. TLSC with NIR selective harvesting cyanine dyes has been demonstrated previously, but the Stokes shifts were all less than 30 nm, thus limiting the larger area optimization. Accordingly, there remains a need to develop transparent luminescent solar concentrators with engineered or tuned Stokes shifts.

SUMMARY

This section provides a general summary of the disclosure, and is not a comprehensive disclosure of its full scope or all of its features.

In various aspects, the current technology provides a luminescent solar concentrator (LSC) device. The LSC device includes a modified luminophore having a polymethine component, the polymethine component including a plurality of methine groups (=CH—)

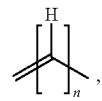

where n is an odd integer greater than 1 and a hydrogen atom (H) of one of the plurality of methine groups is replaced by one of

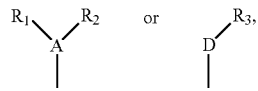

where A is selected from nitrogen (N), phosphorus (P), arsenic (As) and antimony (Sb) and D is selected from oxygen (O), sulfur (S), selenium (Se), and tellurium (Te); $R_1$ and $R_2$ are independently selected from H, aliphatic groups, and aromatic groups bound to A through a carbon atom, or $R_1$ and $R_2$ together form an alicyclic ring containing A; and $R_3$ is selected from H, aliphatic groups, aromatic groups, and alicyclic groups bound to D through a carbon atom.

In one aspect, $R_1$ and $R_2$ are individually selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, substituted or unsubstituted $C_1$-$C_{20}$ aminoalkyl, or $R_1$ and $R_2$ together form a substituted or unsubstituted $C_1$-$C_{20}$ cycloalkyl, or substituted or unsubstituted $C_1$-$C_{20}$ heteroalkyl.

In one aspect, the A is nitrogen (N).

In one aspect, $R_3$ is selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, or substituted or unsubstituted $C_1$-$C_{20}$ aminoalkyl.

In one aspect, the D is oxygen (O).

In one aspect, a central methine group is the one of the plurality of methine groups having the hydrogen atom (H) replaced by the

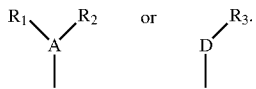

In one aspect, the modified luminophore has an overlap integral (OI) of less than or equal to about 26, and an absolute absorption of greater than or equal to about 50% in absorption spectra, wherein the OI is defined by formula (2):

$$OI = \int_0^\infty A(\lambda) \cdot PL^*(\lambda) d\lambda, \quad (2)$$

where $A(\lambda)$ is a single-path absolute absorption spectrum of a composite film including a luminophore and a host material, and $PL^*(\lambda)$ is a normalized emission spectrum of the luminophore in the host material.

In one aspect, the modified luminophore has an OI of less than or equal to about 3.4.

In one aspect, the modified luminophore also has a Stokes shift of greater than or equal to about 50 nm to less than or equal to about 250 nm.

In one aspect, the modified luminophore has a strongest absorbance maximum of light at a wavelength of greater than or equal to about 400 nm.

In one aspect, the modified luminophore has a strongest peak absorbance of light at a wavelength of greater than or equal to about 650 nm.

In one aspect, the modified luminophore has a strongest peak absorbance of light at a wavelength of less than or equal to about 450 nm.

In one aspect, the modified luminophore has a strongest peak emission of light at a wavelength of greater than or equal to about 650 nm.

In one aspect, the modified luminophore has a strongest peak absorbance of light at a wavelength of greater than or equal to about 650 nm and a strongest peak emission of light at a wavelength of greater than or equal to about 650 nm.

In one aspect, the luminescent solar concentrator device is visibly transparent.

In one aspect, the luminescent solar concentrator device has an average visible transmittance of greater than or equal to about 75%.

In one aspect, the luminescent solar concentrator device has a quantum yield of greater than or equal to about 20%.

In one aspect, the luminescent solar concentrator device has an external quantum efficiency of greater than or equal to about 7%.

In various aspects, the current technology also provides a luminescent solar concentrator (LSC) device including a modified luminophore having a polymethine component, the polymethine component including a plurality of methine groups (=CH—)

where n is an odd integer greater than 1 and a hydrogen atom (H) of one of the plurality of methine groups is replaced by one of

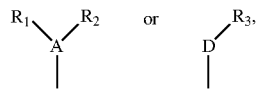

where A is selected from nitrogen (N), phosphorus (P), arsenic (As) and antimony (Sb) and D is selected from oxygen (O), sulfur (S), selenium (Se), and tellurium (Te); $R_1$ and $R_2$ are independently selected from H, aromatic groups, aliphatic groups bound to A through a carbon atom, or $R_1$ and $R_2$ together form an alicyclic ring containing A; and $R_3$ is selected from H, aliphatic groups, aromatic groups, and alicyclic groups bound to D through a carbon atom. The luminophore has an overlap integral (OI) of less than or equal to about 26, and an absolute absorption of greater than or equal to about 50% in absorption spectra, wherein the OI is defined by formula (2):

$$OI = \int_0^\infty A(\lambda) \cdot PL^*(\lambda) d\lambda, \quad (2)$$

where $A(\lambda)$ is a single-path absolute absorption spectrum of a composite film including a luminophore and a host material, and $PL^*(\lambda)$ is a normalized emission spectrum of the luminophore in the host material.

In one aspect, the luminescent solar concentrator device is visibly transparent.

In one aspect, the luminescent solar concentrator device is visibly opaque.

In one aspect, the luminescent solar concentrator device has an average visible transmittance of greater than or equal to about 75%.

In one aspect, the luminescent solar concentrator device is visibly transparent and an has a quantum yield of greater than or equal to about 20%.

In one aspect, the modified luminophore also has a Stokes shift of greater than or equal to about 50 nm to less than or equal to about 250 nm.

In various aspects, the current technology additionally provides a luminescent solar concentrator (LSC) device including a modified organic luminophore having a Stokes shift of greater than or equal to about 50 nm to less than or equal to about 250 nm.

In one aspect, the modified organic luminophore is fluorescent.

In one aspect, the modified organic luminophore has an overlap integral (OI) of less than or equal to about 26, and an absolute absorption of greater than or equal to about 50% in absorption spectra.

In one aspect, the luminescent solar concentrator device is visibly transparent.

In one aspect, the luminescent solar concentrator device has an average visible transmittance of greater than or equal to about 75%.

In one aspect, the luminescent solar concentrator device has a quantum yield of greater than or equal to about 20%.

In various aspects, the current technology yet further provides a method of adjusting a Stokes shift of a luminescent polymethine molecule. The method includes obtaining a luminophore having a polymethine component including a plurality of methine groups (=CH—)

where n is an odd integer greater than 1 and the luminophore has a first Stokes shift. The method also includes replacing a hydrogen (H) atom of one of the plurality of methine groups with a halogen atom to form a halogenated intermediate, and replacing the halogen atom of the halogenated intermediate with one of

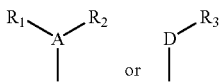

to form a modified luminophore, where A is selected from nitrogen (N), phosphorus (P), arsenic (As) and antimony (Sb) and D is selected from oxygen (O), sulfur (S), selenium (Se), and tellurium (Te); $R_1$ and $R_2$ are independently selected from H, aliphatic groups, and aromatic groups bound to A through a carbon atom, or $R_1$ and $R_2$ together form an alicyclic ring containing A; and $R_3$ is selected from H, aliphatic groups, aromatic groups, and alicyclic groups bound to D through a carbon atom. The modified luminophore has a second Stokes shift that is different from the first Stokes shift.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 3A-3C show schematics of three exemplary transparent luminescent solar concentrators according to various aspects of the current technology.

FIGS. 3D-3F show external quantum efficiencies (EQEs) for the luminescent solar concentrators shown in FIGS. 3A-3C, respectively.

FIG. 5A is a schematic showing a transparent luminescent solar concentrator (TLSC) that selectively harvests near-infrared (NIR) light and emits deeper NIR while passing visible light.

FIG. 5B shows photographs of the TLSCs incorporating Cy7-CA, Cy7-NEt$_2$-I, and Cy7.5-NEt$_2$-I luminophores.

FIGS. 5C-5E show normalized absorption and emission spectra of Cy7-CA (FIG. 5C), Cy7-NEt$_2$-I (FIG. 5D), and Cy7.5-NEt$_2$-I (FIG. 5E) in DCM solutions (solid lines) and polymer films (dashed lines).

FIGS. 8A-8C show position-dependent EQE of Cy7-CA (FIG. 8A), Cy7-NEt$_2$-I (FIG. 8B), and Cy7.5-NEt$_2$-I (FIG. 8C) as a function of wavelength measured from 15 mm to 95 mm, with 10 mm increments.

FIG. 8D shows calculated optical efficiencies (solid lines) as a function of distance d of three cyanine luminophore transparent luminescent solar concentrator systems to fit the measured normalized EQE peak values (symbols).

Figure 9A:
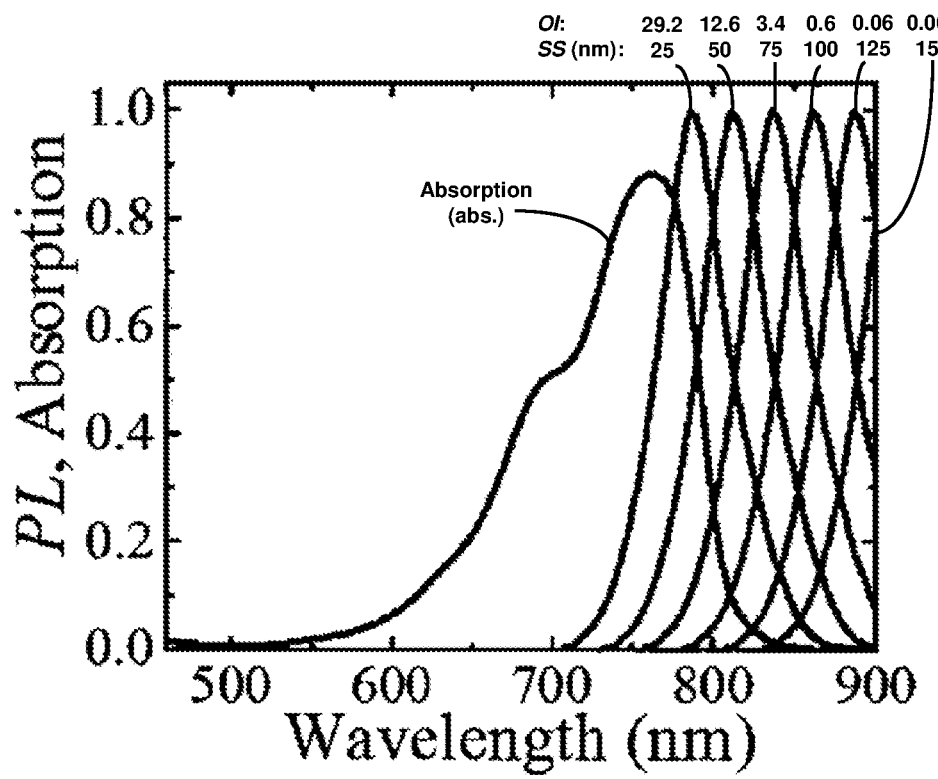

FIG. 9A shows different overlap integral (OI) values obtained by keeping the absolute absorption fixed and shifting the normalized emission spectrum of a luminophore (Cy7-CA). It is noted that OI and SS are not typically equivalent because chemical changes that lead to changes in the SS also lead to spectral changes in the tail absorption. The SS values for the simulation are provided to emphasize the reason that this parameter has been misleadingly considered as a design parameter.

Figure 9B:
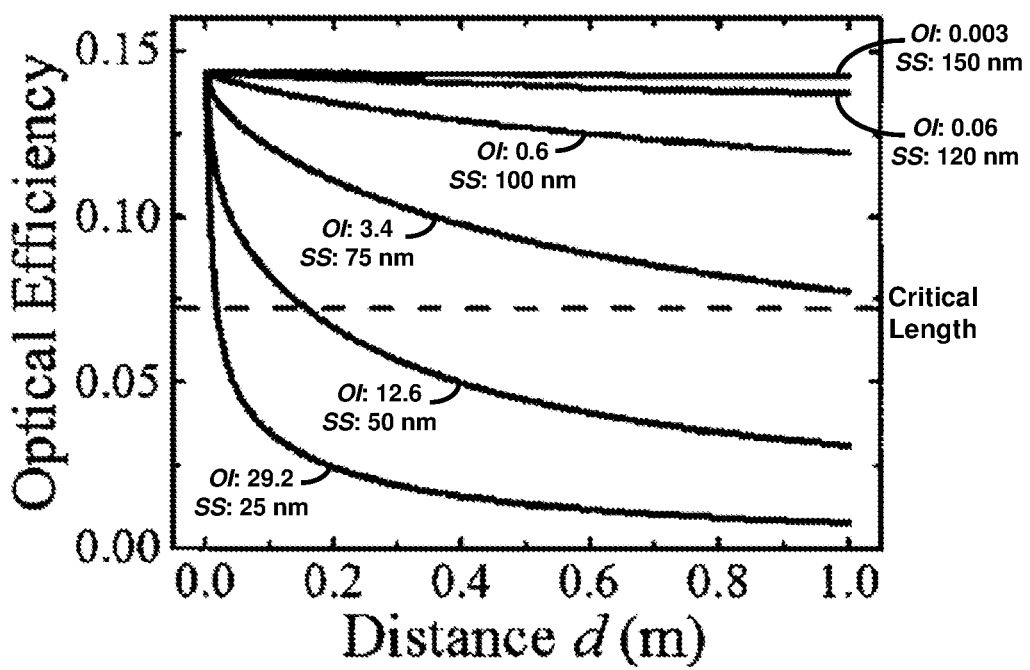

FIG. 9B shows optical efficiencies as a function of plate length L for different OI values.

Figure 10:
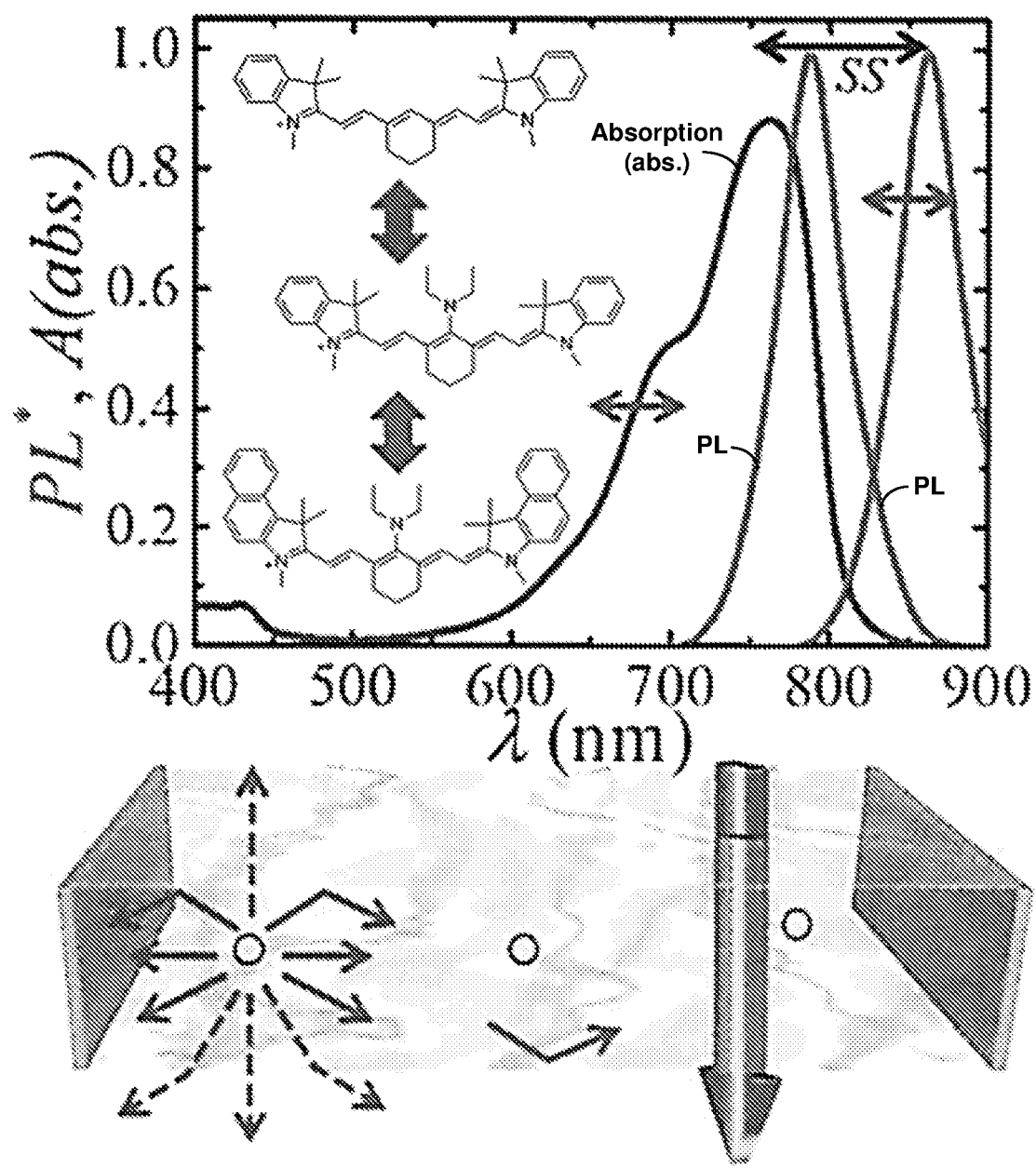

FIG. 10 shows an increase in SS that results from modifying the central methine group of a cyanine dye and an exemplary transparent luminescent solar concentrator.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges. As referred to herein, ranges are, unless specified otherwise, inclusive of endpoints and include disclosure of all distinct values and further divided ranges within the entire range. Thus, for example, a range of "from A to B" or "from about A to about B" is inclusive of A and B.

Example embodiments will now be described more fully with reference to the accompanying drawings.

The current technology provides modified luminophores, i.e., luminescent polymethine dyes, that have at least one of an optical integral (OI) decrease and a Stokes shift increase relative to corresponding base luminescent polymethine dyes that are not modified. The modified luminescent polymethine dyes with an OI decrease and/or a Stokes shift increase enables luminescent solar concentrators with higher power conversion efficiencies (PCE) relative to luminescent solar concentrators including corresponding unmodified luminescent polymethine dyes due to a decrease in reabsorption. The overall power conversion efficiency of a LSC or TLSC system is the product of the component efficiencies:

$$\eta_{LSC} = \eta_{Opt} \cdot \eta^*_{PV} = (1-R_f) \cdot \eta_{Abs} \cdot \eta_{PL} \cdot \eta_{Trap} \cdot \eta_{RA} \cdot \eta^*_{PV} \qquad (1),$$

where $R_f$ is the front surface reflection, $\eta_{Abs}$ is the solar spectrum absorption efficiency of the luminophore, $\eta_{PL}$ is the luminescence efficiency of the luminophore, $\eta_{Trap}$ is the photon trapping (or waveguiding) efficiency, $\eta^*_{PV}$ is the efficiency of the edge-mounted PV cell normalized by its solar spectrum absorption efficiency and EQE at the luminophore wavelength to account for photon downshifting, and $\eta_{RA}$ is the efficiency of suppressing reabsorption. The current technology also provides luminescent solar concentrator devices comprising the modified luminophores and methods of adjusting at least one of an OI and a Stokes shift of a luminophore.

The current technology provides a modified luminophore. As used herein, a "luminophore" is a photoactive molecule that has luminescent properties. The modified luminophores of the current technology are organic, are fluorescent or phosphorescent, and may have a polymethine component. Therefore, the luminophores are luminescent polymethine dyes. As used herein, a polymethine dye or a "base polymethine dye" is a dye having polymethine component comprising a plurality of methine groups, wherein a methine group has the structure =CH—. More particularly, the polymethine component of a polymethine dye has an odd number of methine groups that is greater than 1. As such, a polymethine dye is distinguishable from a polyene, which has an even number of methine groups. Accordingly, the polymethine component of the luminescent polymethine dye has the structure:

where a methine group (=CH—) is in the brackets and n is an odd integer greater than 1.

Polymethine dyes have a first OI and an absolute absorption of greater than or equal to about 50% in absorption spectra, greater than or equal to about 60% in absorption spectra, greater than or equal to about 70% in absorption spectra, or greater than or equal to about 80% in absorption spectra and have a first Stokes shift. As used herein, the term "absolute absorption" refers to the total absorption of a normal incident beam at a particular wavelength. As used herein, a Stokes shift is defined as the wavelength difference between the absorption and emission peak maxima, and an OI quantifies reabsorption properties of a luminophore as:

$$OI = \int_0^\infty A(\lambda) \cdot PL^*(\lambda) d\lambda, \quad (2)$$

where $A(\lambda)$ is the single-path absolute absorption spectrum $(A(\lambda)=1-R(\lambda)-T((\lambda))$ of a luminophore/host composite film and $PL^*(\lambda)d\lambda$ is the normalized emission spectrum of the luminophore in the host material. The OI depends on the thickness of a luminophore layer and the degree of overlap between absorption and emission spectra in a host material (rather than in a solution). Therefore, a decreasing OI corresponds to a decreasing overlap between absorption and emission spectra. By decreasing the overlap between absorption and emission spectra, efficiency losses due to reabsorption are decreased.

The modified luminophores of the current technology are a modified variant of corresponding base luminophore. More particularly, a hydrogen atom (H) of one of the plurality of methine groups of the polymethine component is replaced by one of

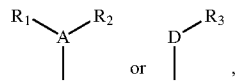

where A is a pnictogen selected from nitrogen (N), phosphorus (P), arsenic (As) and antimony (Sb) and D is a chalcogen selected from oxygen (O), sulfur (S), selenium (Se), and tellurium (Te); $R_1$ and $R_2$ are independently selected from H, aliphatic groups, and aromatic groups bound to A through a carbon atom, or $R_1$ and $R_2$ together form an alicyclic ring containing A; and $R_3$ is selected from H, aliphatic groups, aromatic groups and alicyclic groups bound to D through a carbon atom. In various embodiments, $R_1$ and $R_2$ are individually selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, substituted or unsubstituted $C_1$-$C_{20}$ aminoalkyl, or $R_1$ and $R_2$ together form a substituted or unsubstituted $C_1$-$C_{20}$ cycloalkyl, or substituted or unsubstituted $C_1$-$C_{20}$ heteroalkyl and $R_3$ is selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, or substituted or unsubstituted $C_1$-$C_{20}$ aminoalkyl.

In various embodiments, a central methine group is the one of the plurality of methine groups having the hydrogen atom (H) replaced by the

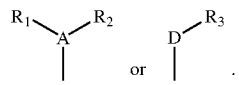

Because the polymethine component has an odd number of methine groups greater than 1, the central methine group is the methine group in the middle of the polymethine component.

The modified luminophore has at least one of a lower OI and a larger Stokes shift relative to a corresponding unmodified (base) luminophore. The OI of the modified luminophore is lower than the OI of the corresponding unmodified luminophore and is less than or equal to about 26, less than or equal to about 20, less than or equal to about 15, less than or equal to about 10, less than or equal to about 5, less than or equal to about 3.4, less than or equal to about 2, or less than or equal to about 1. The Stokes shift of the modified luminophore is larger than the Stokes shift of the corresponding unmodified luminophore and is greater than or equal to about 50 nm to less than or equal to about 250 nm, greater than or equal to about 75 nm to less than or equal to about 225 nm, or greater than or equal to about 100 nm to less than or equal to about 200 nm.

The modified luminophore has a strongest absorbance maximum of light at a wavelength of greater than or equal to about 400 nm, greater than or equal to about 650 nm, or less than or equal to about 450 nm. Many luminophores have a plurality of absorbance maxima that may be in various regions of the spectrum. Therefore, the "strongest absorbance maximum" is the absorbance maximum with the largest peak. Accordingly, the modified luminophore can have a strongest absorbance maximum in the visible (VIS) region of the spectrum, in the ultraviolet (UV) region of the spectrum, in the near infrared (NIR) region of the spectrum, or in the infrared (IR) region of the spectrum. The modified luminophore has a strongest peak emission of light at a wavelength of greater than or equal to about 400 nm or greater than or equal to about 650 nm. Similarly, many luminophores have a plurality of emission maxima that may be in various regions of the spectrum. Therefore, the "strongest peak emission" is the emission maximum with the largest peak. The modified luminophore, dependent on its strongest absorbance maximum and strongest peak emission, can be used for opaque LSCs or visually transparent LSCs.

In some embodiments, the modified luminophore has a strongest absorbance maxima of greater than or equal to about 650 nm, which is in the near infrared (NIR) and infrared (IR) regions of the spectrum, and less than or equal to about 30%, less than or equal to about 20%, less than or equal to about 10%, or less than or equal to about 5% of the total light absorbed by the modified luminophore is absorbed in the visible region of the spectrum. The modified luminophore can also have a strongest peak emission of greater than or equal to about 650 nm, which is in the NIR and IR. Such a modified luminophore can be used in an active layer of a visibly transparent LSC.

In various embodiments, the modified luminophore, i.e., the modified luminophore comprising a polymethine component, is a modified cyanine dye. A first series of exemplary modified cyanine dyes is based off of the unmodified cyanine dye 2-((E)-2-((E)-2-chloro-3-(2-((E)-1,3,3-trimethylindolin-2-ylidene)ethylidene)cyclohex-1-en-1-yl)vinyl)-1,3,3-trimethyl-3H-indol-1-ium iodide. The first series includes the following modified luminophores:

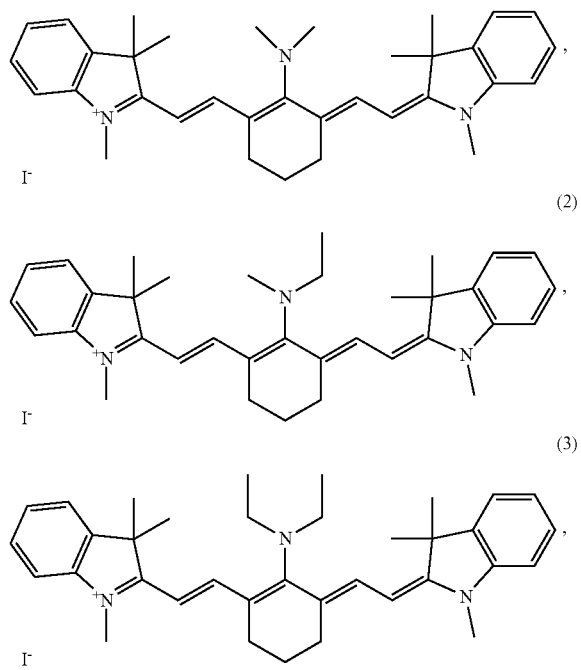

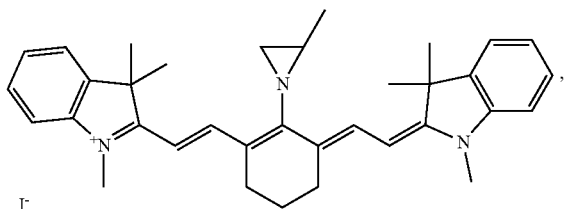

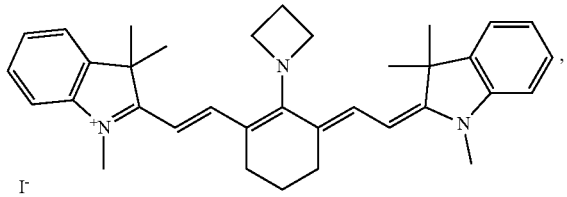

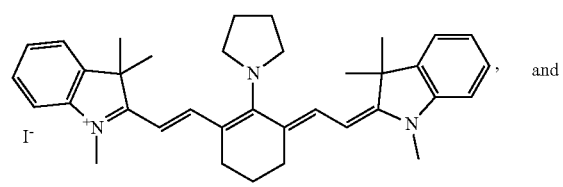

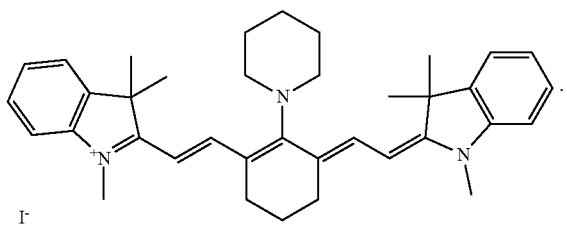

Table 1 provides various characteristics of the first series of exemplary modified luminophores.

TABLE 1

Photophysical properties of the first series of exemplary modified luminophores.

| Dye | Amine substrates | Absorption (nm) | Emission (nm) | Stokes shift (nm) | QY (%) |
|---|---|---|---|---|---|
| 1 | | 664 | 777 | 113 | 28 |
| 2 | | 684 | 778 | 94 | 29 |
| 3 | | 699 | 778 | 79 | 31 |
| 4 | | 742 | 766 | 24 | 25 |
| 5 | | 615 | 704 | 89 | 26 |
| 6 | | 604 | 784 | 180 | 33 |

TABLE 1-continued

Photophysical properties of the first series of exemplary modified luminophores.

| Dye | Amine substrates | Absorption (nm) | Emission (nm) | Stokes shift (nm) | QY (%) |
|---|---|---|---|---|---|
| 7 |  | 668 | 785 | 117 | 23 |

Spectroscopic data for series 1 cyanine dyes. Absorption, emission, and quantum yield were measured in DCM.
QY = quantum yield.

A second series of exemplary modified cyanine dyes is based off of the unmodified cyanine dye 2-((E)-2-((E)-2-chloro-3-((E)-2-(1,1,3-trimethyl-1,3-dihydro-2H-benzo[e]indol-2-ylidene)ethylidene)cyclohex-1-en-1-yl)vinyl)-1,1,3-trimethyl-1H-benzo[e]indol-3-ium iodide. The second series includes the following modified luminophores:

(8)
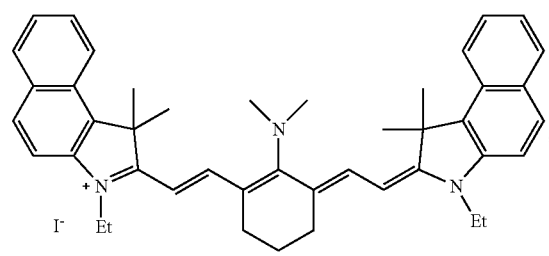

(9)
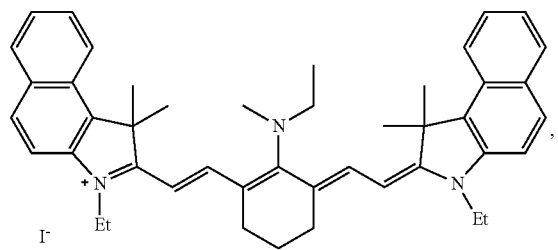

(10)
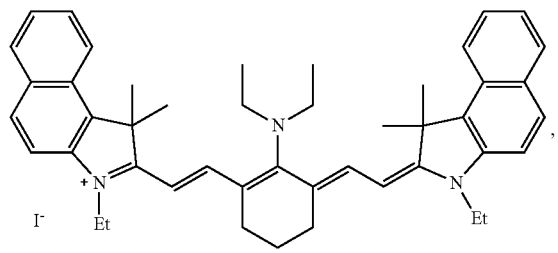

(11)
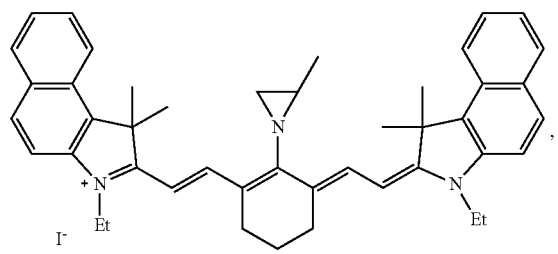

(12)
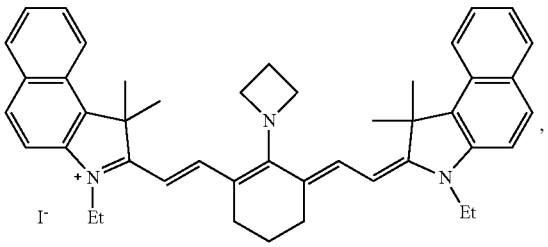

(13)
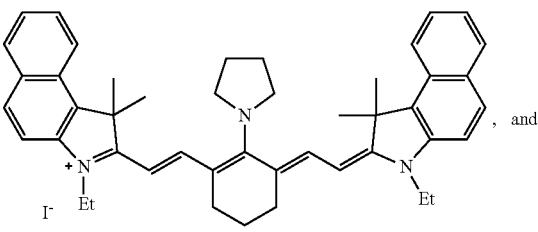

and

(14)
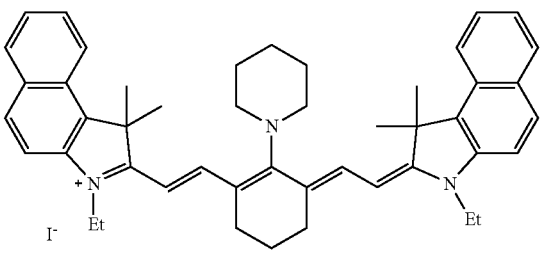

.

Table 2 provides various characteristics of the second series of exemplary modified luminophores.

TABLE 2

Photophysical properties of the second series of exemplary modified luminophores.

| Dye | Amine substrates | Absorption (nm) | Emission (nm) | Stokes shift (nm) | QY (%) |
|---|---|---|---|---|---|
| 8 | N(CH₃)₂ | 705 | 818 | 113 | 24 |
| 9 | N(Et)(Me) | 724 | 816 | 92 | 26 |
| 10 | NEt₂ | 739 | 819 | 80 | 24 |
| 11 | aziridine | 746 | 802 | 56 | 24 |
| 12 | azetidine | 649 | 737 | 88 | 30 |
| 13 | pyrrolidine | 636 | 823 | 187 | 25 |

TABLE 2-continued

Photophysical properties of the second series of exemplary modified luminophores.

| Dye | Amine substrates | Absorption (nm) | Emission (nm) | Stokes shift (nm) | QY (%) |
|---|---|---|---|---|---|
| 14 |  | 708 | 824 | 116 | 21 |

Spectroscopic data for series 2 cyanine dyes. Absorption, emission, and quantum yield were measured in DCM.
QY = quantum yield.

A third series of exemplary modified cyanine dyes is based off of the unmodified cyanine dye 2-[2-[2-Chloro-3-[(1,3-dihydro-3,3-dimethyl-1-propyl-2H-indol-2-ylidene)ethylidene]-1-cyclohexen-1-yl]ethenyl]-3,3-dimethyl-1-propylindolium iodide. The second series includes the following modified luminophores:

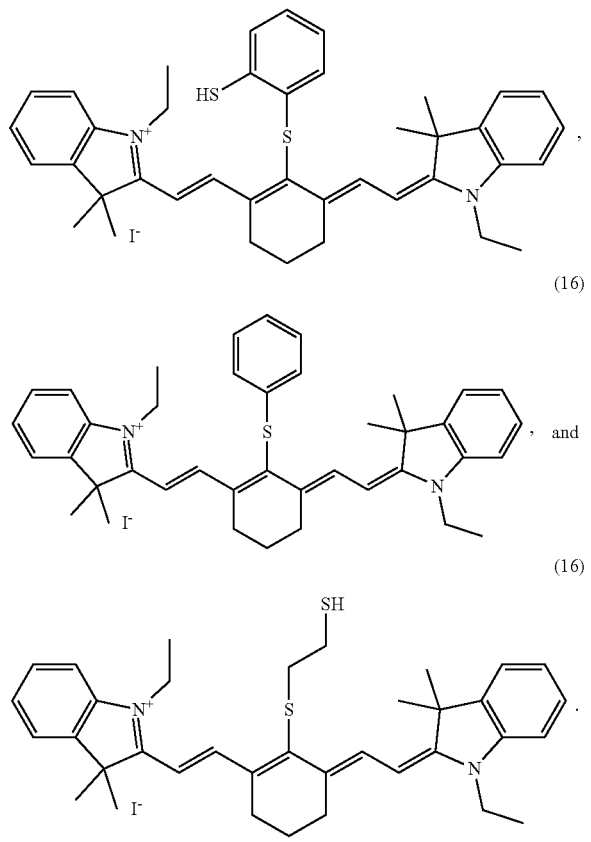

(15), (16), (16)

Table 3 provides various characteristics of the second series of exemplary modified luminophores.

TABLE 3

Photophysical properties of the second series of exemplary modified luminophores.

| Dye | Amine substrates | Absorption (nm) | Emission (nm) | Stokes shift (nm) | QY (%) |
|---|---|---|---|---|---|
| 15 | 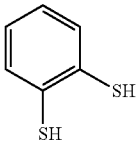 | 616 | 736 | 120 | — |
| 16 | 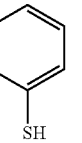 | 803 | 831 | 28 | — |
| 17 | 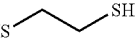 | 791 | 808 | 17 | — |

Spectroscopic data for series 3 cyanine dyes. Absorption, emission, and quantum yield were measured in DCM.
QY = quantum yield.

Figure 1A:
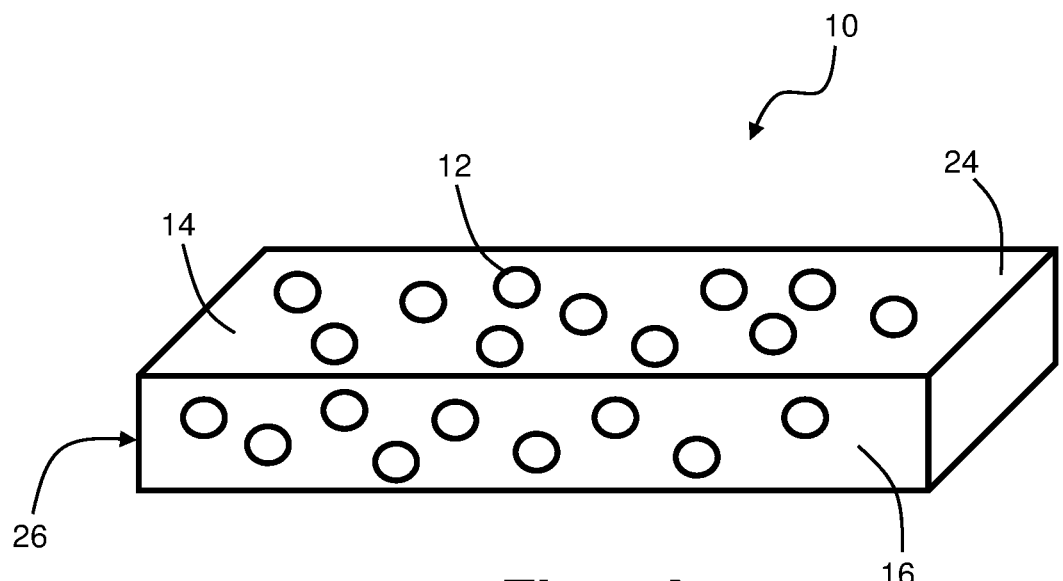
FIG. 1A-1B are schematic illustrations of exemplary luminescent solar concentrator devices including modified luminophores according to various aspects of the current technology.

With reference to FIG. 1A, the current technology provides a luminescent solar concentrator (LSC) device 10 comprising a modified luminophore 12 as described above. The modified luminophore 12 is disposed on a substrate 14 that defines a waveguide 16. More particularly, the modified luminophore 12 is embedded within and throughout the substrate 14 and the waveguide 16.

As described above, the modified luminophore 12 harvests (i.e., absorbs) light with wavelengths in at least one of the visible ("VIS"), NIR, and IR regions of the solar spectrum. As used herein, UV light has a wavelength from about 300 nm to about 450 nm, VIS light has a wavelength from about 450 nm to about 650 nm, NIR light has a wavelength from about 650 nm to about 1500 nm and IR light has a wavelength form about 1500 nm to about 1 mm. Also, as used herein the terms "transparent" or "visibly transparent" refer to devices that have an average visible transmittance of greater than or equal to about 75%, greater than or equal to about 80%, or greater than or equal to about 90%. The terms "opaque" or "visibly opaque" refer to devices that have an average visible transparency, weighted by the photopic response of an eye of 10% or less for specular transmission. Devices that have an average visible transparency, weighted by the photopic response of an eye, of between 10% to 50% for specular transmission are "semitransparent. Therefore, the LSC device 10 can be visually transparent (with modified luminophores that have a strongest peak absorbance in the NIR/IR and a strongest peak emission in the NIR/IR) or visually opaque (having substantial absorbance and/or emission in the VIS), depending on the absorbance and emission properties of the modified luminophore 12 and a composition of the substrate 14. Non-limiting examples of transparent substrates 14 include glass, low iron glass (such as Diamont® low iron glass, and Planilux® transparent glass from Saint Gobain (Pans, France) and Borofloat® 33 borosilicate glass from Schott (Mainz, Germany)), plastic, poly(methyl methacrylate) (PMMA), poly-(ethylmethacrylate) (PEMA), (poly)-butyl methacrylate-co-methyl methacrylate (PBMMA), polyethylene terephthalate (PET), and polyimides, such as Kapton® polyimide films (DuPont, Wilmington, Del.). Non-limiting examples of opaque substrates 14 include amorphous silicon, crystalline silicon, halide perovskites, stainless steel, metals, metal foils, and gallium arsenide.

The modified luminophore 12 is described above and has at least one of an OI of less than or equal to about 26, less than or equal to about 20, less than or equal to about 15, less than or equal to about 10, less than or equal to about 5, less than or equal to about 3.4, less than or equal to about 2, or less than or equal to about 1; an absolute absorption of greater than or equal to about 50% in the absorption spectra, greater than or equal to about 60% in the absorption spectra, greater than or equal to about 70% in the absorption spectra, or greater than or equal to about 80% in the absorption spectra; and a Stokes shift of greater than or equal to about 50 nm to less than or equal to about 250 nm, greater than or equal to about 75 nm to less than or equal to about 225 nm, or greater than or equal to about 100 nm to less than or equal to about 200 nm. The LSC device 10 has a quantum yield of greater than or equal to about 20%, greater than or equal to about 25%, or greater than or equal to about 30% and an EQE of greater than or equal to about 5%, greater than or equal to about 7%, or greater than or equal to about 10%.

Figure 1B:
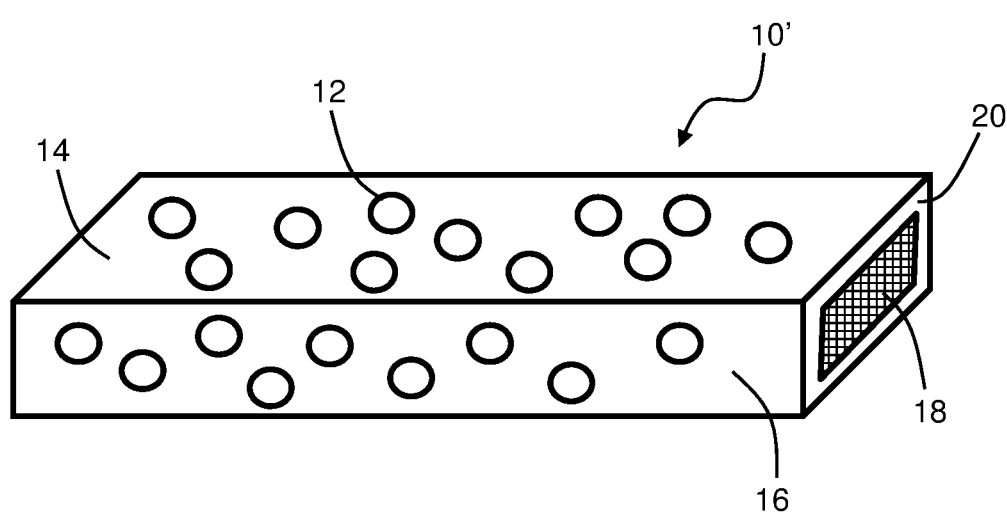

The LSC device 10 also comprises a photovoltaic (PV) component. FIG. 1B shows an LSC device 10' having the same components as the LSC device 10 in FIG. 1. However, the LSC device 10' comprises a PV cell (or strip) 18 disposed on an edge 20 of the waveguide 16. A second PV cell or strip can be disposed on a second edge that is opposite or orthogonal to the edge 20 (not shown). In various embodiments, the LSC device 10' comprises a PV cell (or strip) 18 on at least one edge of the waveguide. Such PV cells or strips 18 can alternatively be mounted along edges orthogonal to the edge 20.

In some embodiments, the LSC device 10 does not include the PV cell (or strip) 18 shown in FIG. 1B, but may include a segmented PV array (not shown). The PV array can be disposed on a surface 24 of the waveguide 16 or within a central region 26 of the waveguide 16, such as in the bulk of the waveguide 16 and the substrate 14. The PV array can be provided as a coating or spraying on the substrate or layering dyed sheets as strata between alternating stacks of the substrate.

In various embodiments, the solar array is a mesh comprising wires, microwires, nanowires, ribbons, slivers, spheres, dots, combinations thereof, or the like arranged within or placed on the surface 24 of the waveguide 16. More than one photovoltaic array can be utilized to reduce thermal losses. The PV cell (or strip) 18 of FIG. 1B and the PV array can comprise any material known in the art. Non-limiting examples of solar array and solar cell materials include germanium (Ge); amorphous germanium (a-Ge); gallium (Ga); gallium arsenide (GaAs); silicon (Si); amorphous silicon (a-Si); silicon-germanium (SiGe); amorphous silicon-germanium (a-SiGe); gallium indium phosphide (GaInP); copper indium selenide, copper indium sulfide, or combinations thereof (CIS); copper indium gallium selenide, copper indium gallium sulfide, or combinations thereof (CIGS); cadmium telluride (CdTe); perovskites (PV), such as $CH_3NH_3PbI_3$, $CH_3NH_3PbCl_3$ and $CH_3NH_3PbBr_3$; and combinations thereof.

In some embodiments, the PV array is wired in series and may include adducts, such as spheres or dots. For example, the solar array may comprise a Si sphere solar array connected by thin-wire electrical connections. In one embodiment, the solar array comprises spheres that are wired together to form a mesh. Advantageously, using spherical or multi-sided solar arrays further increases system efficiency as each cell can capture both direct and indirect sunlight at multiple angles. The solar array can be located at different positions within the substrate 14, at or near the surfaces 24, or the solar array can have a thickness that is about the same overall thickness of the waveguide 16. In some embodiments, the LSC device comprises a plurality of PV arrays located at different positions within the substrate 14.

By positioning segmented solar cell arrays at the top or bottom surfaces 24 of the waveguide 16, it is possible to capture luminesced light before it is lost optically due to dye reabsorption. Alternatively, the PV arrays can be embedded within the waveguide 16. This loss of reabsorption is particularly beneficial for fluorescent materials with small Stokes shifts. Depending on where the PV arrays are positioned in the waveguide 16, the modified luminophore 12 can be either embedded in or juxtaposed to the PV array. Also, by positioning the PV arrays at the top or bottom surface 24 of the waveguide 16, a fraction of forward emitted light can be captured, which further reduces optical losses, and it enhances the efficiency of spatially segmented PV arrays by utilizing a greater fraction of NIR light between cells.

Figure 2:
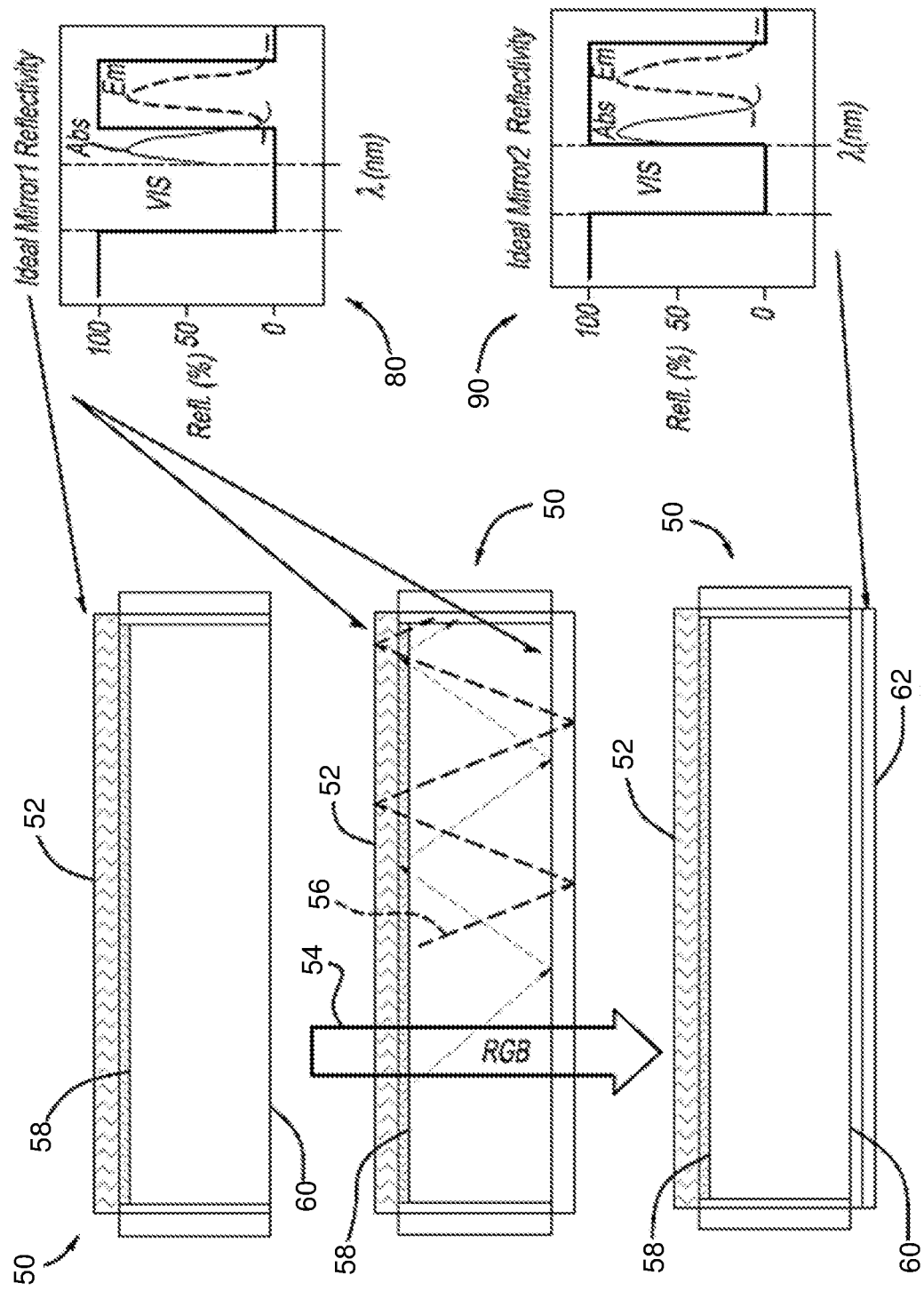
FIG. 2 shows a schematic illustration of an exemplary luminescent solar concentrator device according to various aspects of the current technology.

As shown in FIG. 2, a LSC 50 can comprise a first wavelength-dependent mirror 52. The first wavelength-dependent mirror 52 can have a reflectivity of NIR light corresponding to only an emission spectrum of a modified luminophore as shown in graph 80. Therefore, the first wavelength-dependent mirror 52 is transparent to visible light 54, but reflects NIR light 56 in an emission range shown in the graph 80. The first wavelength-dependent mirror 52 can be functionally coupled to a first surface 58 of the LSC 50, which comprises a modified luminophore. Alternatively, the first wavelength-dependent mirror 52 can be functionally coupled to a second surface 60 of the LSC 50, or to both surfaces 58, 60. In other embodiments, the waveguide redirecting material is on the second surface 60 or embedded within the waveguide.

With further reference to FIG. 2, the LSC 50 can comprise a second wavelength-dependent mirror 62. The second wavelength-dependent mirror 62 can have a reflectivity of NIR light corresponding to both absorption and emission spectra of a modified luminophore as shown in graph 90. The second wavelength-dependent mirror 62 is transparent to visible light 54, but reflects NIR light 56 in an emission range shown in the graph 90. The second wavelength-dependent mirror 62 can be functionally coupled to the first surface 58 of the LSC 50, to the second surface 60 of the LSC 50, or to both surfaces 58, 60. In one embodiment, the first wavelength-dependent mirror 52 is functionally coupled to the first surface 58 of the LSC 50, and the second wavelength-dependent mirror 62 is functionally coupled to the second surface 60 of the LSC 50. As described above, a photovoltaic array can be positioned on the first surface 58, the second surface 60, or within the waveguide. In various embodiments, the LSC 50 comprises a plurality of solar arrays positioned at any of the first surface 58, the second surface 60, or within the waveguide between the first and second surfaces 58, 60. In yet other embodiments, the LSC 50 comprises a solar cell positioned at an edge of the LSC 50 that is adjacent to the first and second surfaces 58, 60.

Incorporation of visibly transparent, selective NIR mirrors 52, 62 in transparent photovoltaics (TPVs) substantially improves power conversion efficiencies by 50-100%. Similarly, the incorporation of the mirrors 52, 62 improves the optical efficiency at low plate dimension by greater than about 20%, while reducing the quantity of modified luminophore needed by about half for a given optical density. For LSC sizes of greater than about 0.5 m², the mirrors 52, 62 are helpful in mitigating any surface and bulk scattering imperfections that could reduce system efficiencies. The mirrors 52, 62 can be coatings that improve collector absorption and increase waveguiding. Moreover, these coating layers are very similar to low-e-coatings that are already ubiquitously deployed and can complement or replace much of their functionality for heat rejection. Alternating layer combinations of $TiO_2$, $SiO_2$, and $Al_2O_3$ can be grown by e-beam evaporation, pulsed laser deposition, plasma-enhanced sputtering, thermal deposition, chemical vapor deposition, or solution deposition to optimize overall color impact and performance.

U.S. Publication No. 2014/0283896 describes various LSC architectures that can be utilized with the current modified luminophores and is incorporated herein by reference in its entirety.

As described above, the LSC device 10 of FIG. 1 comprises a modified luminophore having a polymethine component, the polymethine component comprising a plurality of methine groups (=CH—)

where n is an odd integer greater than 1, and a hydrogen atom (H) of one of the plurality of methine groups is replaced by one of

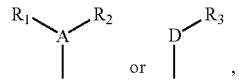

where A is selected from nitrogen (N), phosphorus (P), arsenic (As) and antimony (Sb) and D is selected from oxygen (O), sulfur (S), selenium (Se), and tellurium (Te); $R_1$ and $R_2$ are independently selected from H, aliphatic groups, and aromatic groups bound to A through a carbon atom, or $R_1$ and $R_2$ together form an alicyclic ring containing A; and $R_3$ is selected from H, aliphatic groups, aromatic groups and alicyclic groups bound to D through a carbon atom. In various embodiments, $R_1$ and $R_2$ are individually selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, substituted or unsubstituted $C_1$-$C_{20}$ aminoalkyl, or $R_1$ and $R_2$ together form a substituted or unsubstituted $C_1$-$C_{20}$ cycloalkyl, or substituted or unsubstituted $C_1$-$C_{20}$ heteroalkyl and $R_3$ is selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, or substituted or unsubstituted $C_1$-$C_{20}$ aminoalkyl. The modified luminophore has at least one of a Stokes shift of greater than or equal to about 50 nm to less than or equal to about 250 nm and an OI of less than or equal to about 26 and an absolute absorption of greater than or equal to about 50% in absorption spectra.

Additionally, the current technology provides a luminescent solar concentrator device comprising a modified organic luminophore having a Stokes shift of greater than or equal to about 50 nm to less than or equal to about 250 nm. The luminescent solar concentrator device has a quantum yield of greater than or equal to about 20%, greater than or equal to about 25%, or greater than or equal to about 30%

In some embodiments, the modified organic luminophore has an OI of less than or equal to about 26 and an absolute absorption of greater than or equal to about 50% in absorption spectra. Moreover, the luminescent solar concentrator device can be visibly transparent with an average visible transmittance of greater than or equal to about 75%.

The current technology also provides a method of adjusting or tuning at least one of a Stokes shift and an OI of a luminophore. The method comprises obtaining a luminophore having a polymethine component comprising a plurality of methine groups (=CH—)

where n is an odd integer greater than 1, and the luminophore has a first Stokes shift and a first OI.

The method then comprises replacing a hydrogen (H) atom of one of the plurality of methine groups with a halogen atom to form a halogenated intermediate comprising

where X is a halogen selected from the group consisting of fluorine (F), chlorine (Cl), bromine (Br), or iodine (I).

The method then comprises replacing the halogen atom of the halogenated intermediate with one of

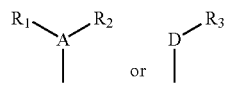

to form a modified luminophore, where A is a pnictogen selected from nitrogen (N), phosphorus (P), arsenic (As) and antimony (Sb) and D is a chalcogen selected from oxygen (O), sulfur (S), selenium (Se), and tellurium (Te); $R_1$ and $R_2$ are independently selected from H, aliphatic groups, and aromatic groups bound to A through a carbon atom, or $R_1$ and $R_2$ together form an alicyclic ring containing A; and $R_3$ is selected from H, aliphatic groups, aromatic groups and alicyclic groups bound to D through a carbon atom. In various embodiments, $R_1$ and $R_2$ are individually selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, substituted or unsubstituted $C_1$-$C_{20}$ aminoalkyl, or $R_1$ and $R_2$ together form a substituted or unsubstituted $C_1$-$C_{20}$ cycloalkyl, or substituted or unsubstituted $C_1$-$C_{20}$ heteroalkyl and $R_3$ is selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, or substituted or unsubstituted $C_1$-$C_{20}$ aminoalkyl. The modified luminophore has at least one of a second Stokes shift that is different form the first Stokes shift or a second OI (and an absolute absorption of greater than or equal to about 50% in absorption spectra) that is different from the first OI.

Embodiments of the present technology are further illustrated through the following non-limiting example.

Example 1

Visibly transparent luminescent solar concentrators (TLSC) have the potential to turn existing infrastructures into net-zero-energy buildings. However, reabsorption loss currently limits the device performance and scalability. This loss is typically defined by the Stokes shift (SS) between the absorption and emission spectra of luminophores. Here, large Stokes shifts TLSCs are developed by modifying the central methine coordination of NIR selective cyanine dyes, resulting in Stokes shifts over 80 nm with simultaneously improved QY. These changes in SS are explained by ab initio calculations which show that the distortion about the central amino group in the excited states decreases the energy of the lowest unoccupied molecular orbitals (LUMO) energy. The corresponding TLSC devices exhibit a 30% PCE improvement for a 25.8 cm² device that was found to stem, surprisingly, not from the changes in SS but from changes in the absorption width and improved quantum yield. These trends are quantitatively confirmed by distance dependence quantum efficiency measurements and optical modeling. Thus, a new parameter is introduced to replace the Stokes shift, the overlap integral, to more accurately correlate the true reabsorption loss, act as a fast screening parameter, and prevent misleading expectations in performance. In deriving this parameter, new approaches towards minimizing the loss to reabsorption are proposed as a roadmap for both LSC and TLSC designs to help realize their full potential.

EXPERIMENTAL

Cyanine Dyes Synthesis and General Instrumentation:
1) Cy7-CA.

1-(5-carboxypentyl)-3,3-dimethyl-2-((E)-2-((E)-3((E)-2-(1,3,3-trimethylindolin-2ylidene)ethylidene)cyclohex-1-enyl)vinyl)-3H-indolium chloride (Cyanine7 carboxylic acid or Cy7-CA) (Lumiprobe) is characterized as received without further purification.

2) Cy7-NEt$_2$-I and Cy7.5-NEt$_2$-I.

Solvents and reagents used for reactions are purchased from commercial sources. HPLC grade acetonitrile (Sigma-Aldrich) is used for all reactions. Column chromatography is performed using SiliCycle silica gel (230-400 mesh). Thin layer chromatography (TLC) with fluorescent indicator is purchased from Analtech. ¹H-NMR and ¹³C-NMR spectra are obtained on Varian Inova 500 MHz instruments and are reported in parts per million (ppm) relative to the solvent resonances (δ), with coupling constants (J) in Hertz (Hz). HRMS analysis is performed on a Q-TOF Ultima system using electrospray ionization in positive mode. UV-Vis spectra are recorded on an Agilent Cary 100 series spectrophotometer. PL is recorded on a Fluorolog equipped with ISA instrument (Horiba, Jobin-Yvon).

General Synthesis:

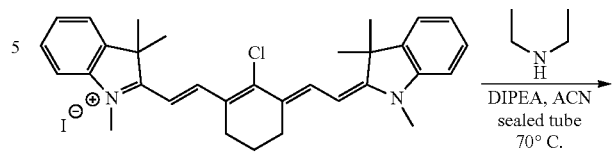

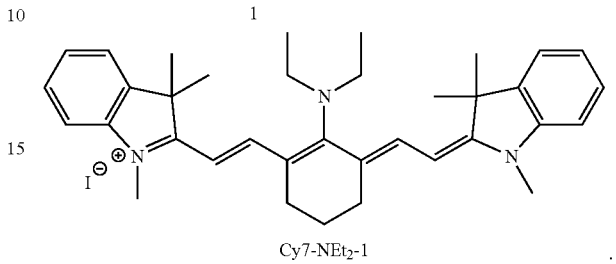

Cy7-NEt$_2$-1

2-((E)-2-((E)-2-(diethylamino)-3-(2-((E)-1,3,3-trimethylindolin-2-ylidene)ethylidene)cyclohex-1-en-1-yl)vinyl)-1,3,3-trimethyl-3H-indol-1-ium iodide (Cy7-NEt$_2$-I)

Compound 1 is synthesized according to the previous reported procedures. To a solution of 1 (74 mg, 0.10 mmol), diisopropylethylamine (DIPEA) (35 μL, 2 equiv, 0.20 mmol) in acetonitrile (2 mL) is added freshly distilled diethylamine (206 μL, 20 equiv, 2.0 mmol) under nitrogen. The mixture is stirred at 70° C. and the reaction is monitored by LC-MS. Upon completion, typically in 48 h, the mixture is concentrated on reduced pressure and purified by flash column (100% DCM gradually to 5% MeOH/DCM). The product is isolated as a dark solid (21 mg, 0.032 mmol, 32%). ¹H NMR (500 MHz, Chloroform-d) δ 7.52 (d, J=13.6 Hz, 2H), 7.34-7.26 (m, 4H), 7.11 (m, 2H), 7.02 (d, J=7.9 Hz, 2H), 5.80 (d, J=13.6 Hz, 2H), 3.65 (q, J=6.9 Hz, 4H), 3.52 (s, 6H), 2.49 (t, J=6.5 Hz, 4H), 1.82 (p, J=6.5 Hz, 2H), 1.60 (s, 12H), 1.28 (t, J=6.9 Hz, 6H). ¹³C NMR (126 MHz, Chloroform-d) δ 174.15, 169.83, 143.19, 142.52, 140.06, 128.57, 125.76, 123.76, 121.97, 109.50, 96.95, 49.47, 48.03, 31.36, 29.07, 24.88, 21.98, 14.84. HRMS (ESI+): calcd for $C_{36}H_{46}N_3^+$ [M]⁺ 520.3690, found 520.3692.

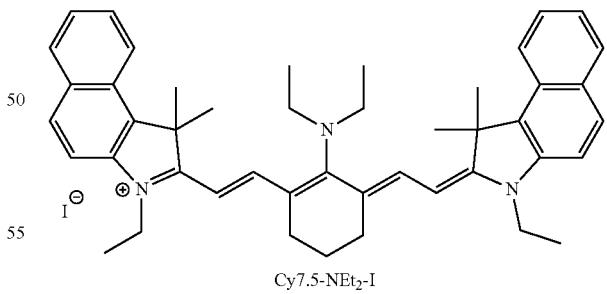

Cy7.5-NEt$_2$-I 2-((E)-2-((E)-2-(diethylamino)-3-((E)-2-(3-ethyl-1,1-dimethyl-1,3-dihydro-2H-benzo[e]indol-2-ylidene)ethylidene)cyclohex-1-en-1-yl)vinyl)-3-ethyl-1,1-dimethyl-1H-benzo[e]indol-3-ium iodide (Cy7.5-NEt$_2$-I)

Cy7.5-NEt$_2$-I is prepared according to the same procedure described for Cy7-NEt$_2$-I. The product is isolated as a dark solid (36 mg, 0.046 mmol, 46%). $^1$H NMR (500 MHz, Chloroform-d) δ 8.07 (d, J=8.5 Hz, 2H), 7.89 (d, J=8.9 Hz, 4H), 7.69 (d, J=13.7 Hz, 2H), 7.58-7.51 (m, 2H), 7.42-7.37 (m, 2H), 7.34 (d, J=8.8 Hz, 2H), 5.89 (d, J=13.7 Hz, 2H), 4.15 (q, J=7.2 Hz, 4H), 3.70 (q, J=6.9 Hz, 4H), 2.53 (t, J=6.4 Hz, 4H), 1.93 (s, 12H), 1.89-1.85 (m, 2H), 1.44 (t, J=7.2 Hz, 6H), 1.35 (t, J=6.9 Hz, 6H). $^{13}$C NMR (126 MHz, Chloroform-d) δ 173.00, 170.56, 142.05, 139.64, 132.46, 131.29, 130.56, 130.10, 128.33, 127.57, 125.62, 124.37, 121.82, 110.20, 96.22, 50.06, 49.39, 39.18, 28.59, 28.44, 25.01, 22.05, 14.96, 12.31. HRMS (ESI+): calcd for $C_{46}H_{54}N_3^+$ [M]$^+$ 648.4319, found 648.4318.

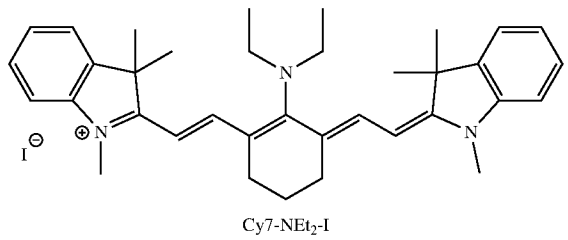 [SMILES: CCN(CC)C1=C(/C=C/C2=[N+](C)c3ccccc3C2(C)C)CCC/C1=C\C=C1\N(C)c2ccccc2C1(C)C ; [I-]]

Cy7-NEt$_2$-I

Numerical Modeling: The LSC system efficiency can be calculated by Equation (1) below:

$$\eta_{LSC} = \eta_{Opt} \cdot \eta^*_{PV} = (1-R_f) \cdot \eta_{Abs} \cdot \eta_{PL} \cdot \eta_{Trap} \cdot \eta_{RA} \cdot \eta^*_{PV} \quad (1)$$

where $R_f = (n_{sub}-1)^2/(n_{sub}+1)^2$, $\eta_{Trap} = \sqrt{1-1/n_{sub}^2}$, $$\eta_{Abs} = \int_{300nm}^{E_g^{lum}} AM1.5G(\lambda) \cdot A(\lambda)^{abs} d\lambda \Big/ \int_{300nm}^{\infty} AM1.5G(\lambda) d\lambda,$$

and $A(\lambda)^{abs}$ is the absolute absorption spectrum of the luminophore/polymer composite film, $E_g^{lum}$ is the bandgap of the luminophore and AM1.5G(Δ) is the air mass 1.5 global solar photon flux spectrum. The PV efficiency under the downconverted luminescence is:

$$\eta^*_{PV} = \left(\frac{\eta_{PV}(AM1.5G)}{\eta^{PV}_{Abs}(AM1.5G)}\right) \cdot \frac{\int \eta_{EQE}(\lambda) \cdot PL^*(\lambda) d\lambda}{\int \eta_{EQE}(\lambda) d\lambda},$$

where $\eta_{EQE}(\lambda)$ is the external quantum efficiency of the edge-mounted PV as a function of wavelength, PL*(λ) is the normalized luminophore photoluminescence emission spectrum in and $\eta_{Abs}^{PV}$(AM1.5G) is the absorption efficiency of the PV material rather than the luminophore which has been defined above. $\eta_{PL}$ is the measured photoluminescence quantum yield of the luminophore in luminophore/polymer composite film:

$$\eta_{RA} = \frac{1-\eta_{RAP}}{1-\eta_{RAP} \cdot \eta_{PL} \cdot \eta_{RAP}}, \quad (3)$$

where the reabsorption probability, $\eta_{RAP}$, is integrated over all emission angles and the absorptive path length is corrected for each take-off angle in a rectilinear system as:

$$\eta_{RAP} = \frac{\int_0^\infty d\lambda \int_{\theta_{crit}}^{\pi/2} d\theta \int_{-\varphi}^{\varphi} \sin(\theta) \cdot PL(\lambda) \cdot \left(1-\exp\left[-A(\lambda)^{abs} \cdot \frac{\sin(\theta) \cdot \cos(\theta)}{t} \cdot \frac{(t_0+t)}{t}\right]\right) d\varphi}{\int_0^\infty d\lambda \int_{\theta_{crit}}^{\pi/2} d\theta \int_{-\varphi}^{\varphi} \sin(\theta) \cdot PL(\lambda) d\varphi}, \quad (4)$$

where the critical angle (emission cone) is $\theta_{crit} = \sin^{-1}(1/n_{sub})$, $A(\lambda)^{abs}$ is the single-path absolute absorption spectrum of the luminophore/polymer composite film, θ is the azimuth relative to the normal of the LSC waveguide, t is the thickness of the luminophore/polymer composite film, $t_0$ is the waveguide thickness, and $\varphi = \arctan^{-1}(2L/d)$ is the in-plane rotation angle, L is the plate length and d is the distance from excitation source to edge-mounted Si PV (as shown in FIG. 3B).

Module Fabrication: 100 mgL-1 Cy7-CA (150 mgL-1 Cy7-NEt$_2$-I or 150 mgL-1 Cy7.5-NEt$_2$-I) ethanol solution is mixed with mounting medium (Fluoroshield F6182, Sigma-Aldrich) at a volume ratio of 1:2. This mixture is drop-cast on 5.08 cm×5.08 cm×0.635 cm glass sheets (for photovoltaic characterization) twice and allowed to dry for 6 h for each layer in a glove-box filled with nitrogen gas (O$_2$, H$_2$O less than 1 ppm), resulting in a layer thickness of approximately 0.5 mm. Dichloromethane is mixed with (poly)-butyl methacrylate-co-methyl methacrylate (PBMMA) (Sigma-Aldrich) at a volume ratio of 1:1. This mixture is then drop cast onto the dye/Fluoroshield composite film to make a smooth and flat surface to avoid light scattering in the waveguide and act as a protection layer. The same layer structure is applied for 2.54 cm×2.54 cm×0.1 cm (for PL measurements) or 1.27 cm×1.27 cm×0.07 cm (for QY measurements). For photovoltaic measurements, single-crystalline solar cells (Vikocell) are laser cut into 5.08 cm×0.635 cm strips for PCE and EQE measurements and 10.16 cm×0.635 cm strips for EQE versus SS measurements. For PCE measurements, two PV strips are mounted on orthogonal edges using index matching gel (Thorlabs) to attach the PV strips on glass edges seamlessly and are connected in parallel. The remaining two edges are covered with specular film reflector (DF2000MA series, 3M). For EQE measurements, one PV strip is attached to one edge of the waveguide with the other three edges painted black. FIGS. 3A-3C show J-V EQE schematics of three TLSCs and FIGS. 3D-3F show EQEs of the three TLSCs.

TABLE 4

Selected characteristics of the three TLSCs.

| Int. Jsc (mA/cm$^2$) | 5 mm | 15 mm | 25 mm | 35 mm | 45 mm |
|---|---|---|---|---|---|
| Cy7-CA | 1.17 | 0.95 | 0.92 | 0.88 | 0.87 |
| Cy7-Net$_2$-I | 1.55 | 1.36 | 1.16 | 1.07 | 0.96 |
| Cy7.5-Net$_2$-I | 1.05 | 0.86 | 0.76 | 0.75 | 0.66 |

Optical Characterization: Specular transmittance of both solutions and films are measured using a dual-beam Lambda 800 UV/VIS spectrometer in the transmission mode. The PL for the three cyanine dyes in both solutions and polymer films are measured by using a PTI QuantaMaster 40 spectrofluorometer with excitation at 675 nm for Cy7-CA and 650 nm for Cy7-NEt$_2$-I and Cy7.5 NEt$_2$ I. Quantum yield measurements are tested by using Hamamatsu Quantaurus fluorometer, excitation ranges in scan mode (10 nm per scan step) are adjusted to 700-750 nm for Cy7-CA, 650-700 nm for Cy7-NEt$_2$-I, and 680-730 nm for Cy7.5-NEt$_2$-I. Six QY values are collected for each individual cyanine dye, and the reported QY for each cyanine dye in Table 5 is averaged from these six QY values with corresponding excitation wavelengths.

Figure 4A:
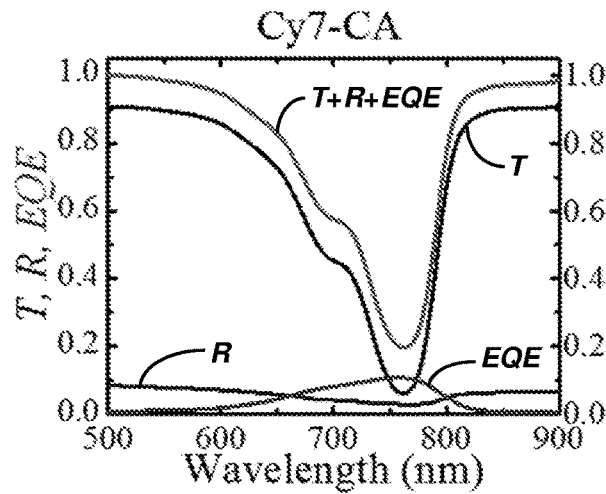
FIGS. 4A-4C show optical scans for the three luminescent solar concentrators shown in FIGS. 3A-3C, respectively.
Figure 4B:
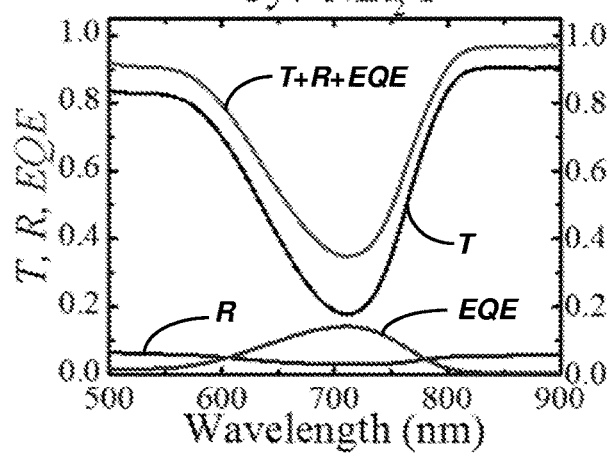
Figure 4C:
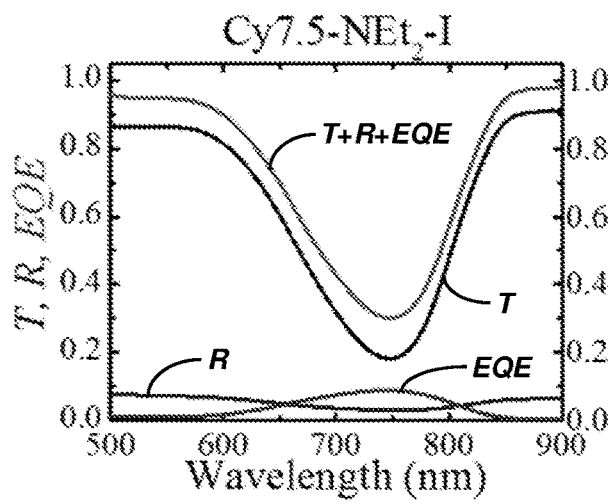

Module Photovoltaic Characterization: J-V measurements are obtained using a Keithley 2420 source measurement under simulated AM1.5G solar illumination (xenon arc lamp with the spectral-mismatch factor of 0.97±0.03 for all the devices being tested). The light intensity is calibrated with an NREL-calibrated Si reference cell with KG5 filter. For position-dependent EQE measurements, the excitation beam is obtained by directing chopped incident light from a quartz tungsten halogen lamp through a monochromator. EQE scans are performed by positioning the monochromatic excitation beam from a fiber perpendicular to the LSC waveguide front surface at various distances from a single edge-mounted Si PV cell. The measured EQE is corrected by the geometric factor, $g=\pi/\tan-1(L/2d)$, which accounts for the different angle subtended by the solar cell at various distance d, where L is the LSC plate length. Note that both PCE and EQE measurements for each cyanine dye are tested by using the same TLSC to match the $J_{sc}$ with the integrated $J_{sc}$, and a matte black background is placed on the back of the tested TLSC to eliminate the illumination from the environment or reflection (double pass) for both PCE and EQE measurements. The same PV cells mounted around the edge are also utilized to eliminate any PV-to-PV variations in performance. FIGS. 4A-4C show optical spectra for three TLScs.

Optical Modeling: The reabsorption and forward emission losses are estimated with luminophore (Cy7-CA) absorption, emission spectra, distance d, and TLSC plate length L. The TLSC system optical efficiencies, in considering reabsorption losses from the overlap in the absolute absorption, and normalized emission spectra are numerically evaluated in Matlab as a function of distance d, plate length L, plate thickness t0, and dye/polymer film thickness t. The complete equations used in the simulations are provided above.

Figure 6C:
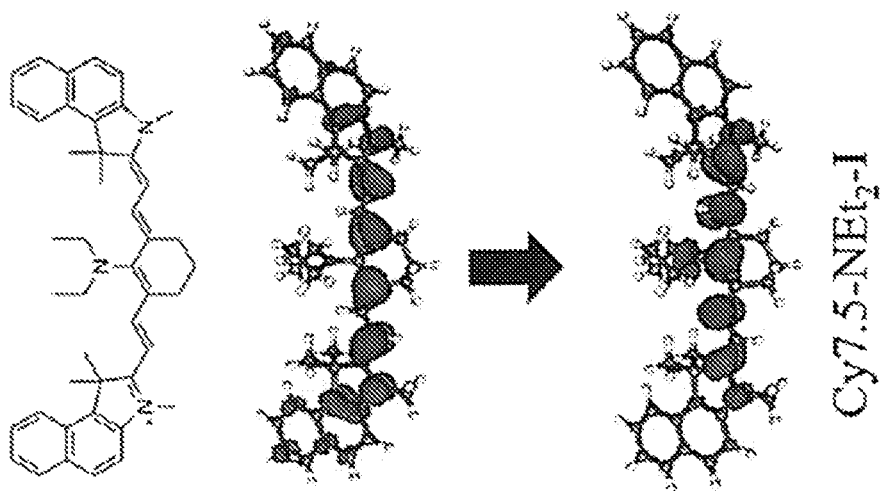
FIGS. 6A-6C are the molecular structures of HOMO and LUMO electronic orbitals of Cy7-CA (FIG. 6A), Cy7-NEt$_2$-I (FIG. 6B), and Cy7.5-NEt$_2$-I (FIG. 6C).
Figure 6B:
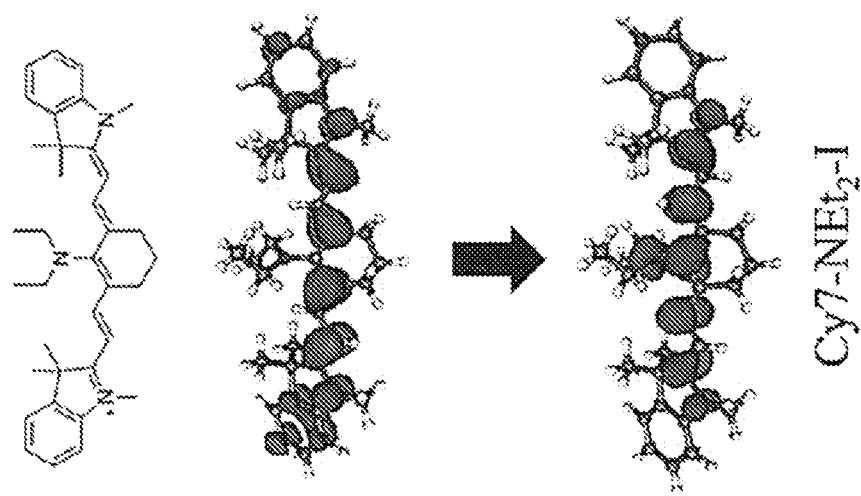
Figure 6A:
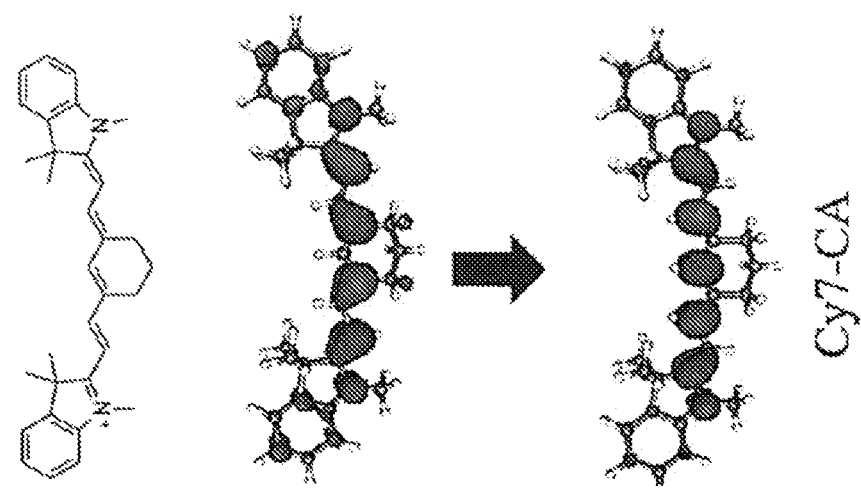

Electronic Structure Calculations: The geometries of Cy7-CA, Cy7 NEt$_2$-I, and Cy7.5-NEt$_2$-I are optimized in their ground and first excited electronic states to elucidate the relaxation motions responsible for the enhanced Stokes shifts of Cy7-NEt$_2$-I and Cy7.5-NEt$_2$-I. The charged side chain on the Cy7-CA and two ethyl groups on the two nitrogen atoms terminating the polymethine backbone of Cy7.5-NEt$_2$-I are replaced by methyl groups to reduce the cost of calculations. This is expected to have little effect on the Stokes shifts because the HOMO and LUMO do not extend to these side chains as shown in FIGS. 6A-6C. Calculations are performed at the linear response time-dependent density functional level of theory using the Tera-Chem software package. The CAM-B3LYP functional and 6-31G* basis is used, and all calculations were performed in the gas phase. Though sometimes predicting inaccurate vertical excitation energies, TDDFT is known to give an accurate description of the shape of the excited state potential energy surface (e.g., SS). These calculations are enabled by the Extreme Science and Engineering Discovery Environment (XSEDE). Torsion angles are defined as the mean of the two C1-C2-N—C3 dihedral angles where C2 is the central carbon atom of the polymethine chain and N is the nitrogen of the amino group.

Results and Discussion

Two key parent cyanine salts are focused on that are derivatized to modify the Stokes shift: 2-((E)-2-((E)-2-chloro-3-(2-((E)-1,3,3-trimethylindolin-2-ylidene)ethylidene)cyclohex-1-en-1-yl)vinyl)-1,3,3-trimethyl-3H-indol-1-ium iodide and 2-((E)-2-((E)-2-chloro-3-((E)-2-(1,1,3-trimethyl-1,3-dihydro-2H-benzo[e]indol-2-ylidene) ethylidene)cyclohex-1-en-1-yl)vinyl)-1,1,3-trimethyl-1H-benzo[e]indol-3-ium iodide. These parent compounds are converted via the addition/elimination reaction of the Cl on the central methine backbone to 2-((E)-2-((E)-2-(diethylamino)-3-(2-((E)-1,3,3-trimethylindolin-2-ylidene)ethylidene)cyclohex-1-en-1-yl)vinyl)-1,3,3-trimethyl-3H-indol-1-ium iodide (Cy7-Net$_2$-I) and 2-((E)-2-((E)-2-(diethylamino)-3-((E)-2-(3-ethyl-1,1-dimethyl-1,3-dihydro-2H-benzo[e]indol-2-ylidene)ethylidene)cyclohex-1-en-1-yl)vinyl)-3-ethyl-1,1-dimethyl-1H-benzo[e]indol-3-ium iodide (Cy7.5-NEt$_2$-I). In addition, 1-(5-carboxypentyl)-3,3-dimethyl-2-((E)-2-((E)-3((E)-2-(1,3,3-trimethylindolin-2ylidene)ethylidene)cyclohex-1-enyl)vinyl)-3H-indolium chloride (Cy7-CA) is also included for comparison. The truncated Cy7-CA, Cy7-NEt$_2$-I, and Cy7.5-NEt$_2$-I molecular structures are shown in FIGS. 6A-6C. Although a large number of different substituents, substituted at C4 with SS ranging from less than 20 nm to greater than 180 nm can be tested, here, these two particular derivatives for device integration are focused on as they provide the highest SS and QY with selective absorption in NIR range of the solar spectrum. The absorption and emission spectra in both dichloromethane (DCM) solution and in a polymer matrix of all three cyanine dyes are plotted in FIGS. 5C-5E. Cy7-CA acts as the control luminophore with a small Stoke shift of 27 nm in DCM. The Stokes shift of the diethylamino substituted analog, Cy7-NEt$_2$-I is increased to 84 nm with a QY of 302% and an absorption peak of 700 nm in DCM. Similarly, the modified Cy7.5-NEt$_2$-I also shows an increased SS of 81 nm with a red-shifted absorption peak of 738 nm compared to Cy7-NEt$_2$-I. The QYs of these three cyanine dyes are summarized in Table 5 where the QY of the three cyanine dyes in the polymer film are modestly reduced compared to that in DCM solution. Density functional theory based calculations shown in FIGS. 6A-6C are utilized to understand the mechanism of the Stokes shift variation.

The NEt$_2$ substitution leads to additional relaxation in the central amino groups of Cy7-NEt$_2$-I and Cy7.5-NEt$_2$-I, which is presumably responsible for the increased Stokes shift.

TABLE 5

Summary of absorption λmax, emission λmax, Stokes shifts (SS) and quantum yields (QYs) of Cy7-CA. Cy7-NEt$_2$-I, and Cy7.5-NEt$_2$-I in DCM and polymer films.

|  |  | Absorption $\lambda_{max}$ (nm) | Emission $\lambda_{max}$ (nm) | SS (nm) | QY (%) |
|---|---|---|---|---|---|
| Cy7-CA | Solution | 760 (1.631 eV) | 787 (1.575 eV) | 27 | 24 ± 1 |
|  | Polymer | 762 (1.627 eV) | 788 (1.573 eV) | 26 | 19 ± 1 |
| Cy7-NEt$_2$-I | Solution | 700 (1.771 eV) | 784 (1.581 eV) | 84 | 30 ± 2 |
|  | Polymer | 710 (1.746 eV) | 780 (1.590 eV) | 70 | 26 ± 1 |
| Cy7.5-NEt$_2$-I | Solution | 738 (1.680 eV) | 819 (1.514 eV) | 81 | 23 ± 1 |
|  | Polymer | 746 (1.662 eV) | 816 (1.519 eV) | 70 | 15 ± 1 |

Figure 7A:
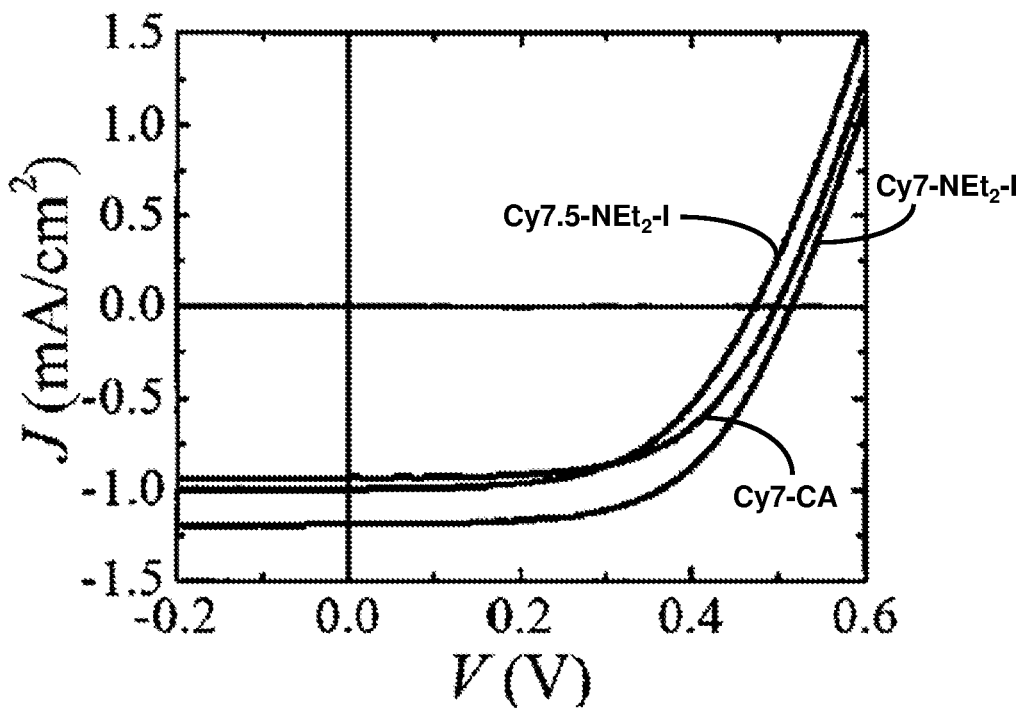
FIG. 7A shows current density as a function of voltage (J-V curves) for the fully assembled transparent luminescent solar concentrator (TLSCs) systems with three of the cyanine dyes.
Figure 7B:
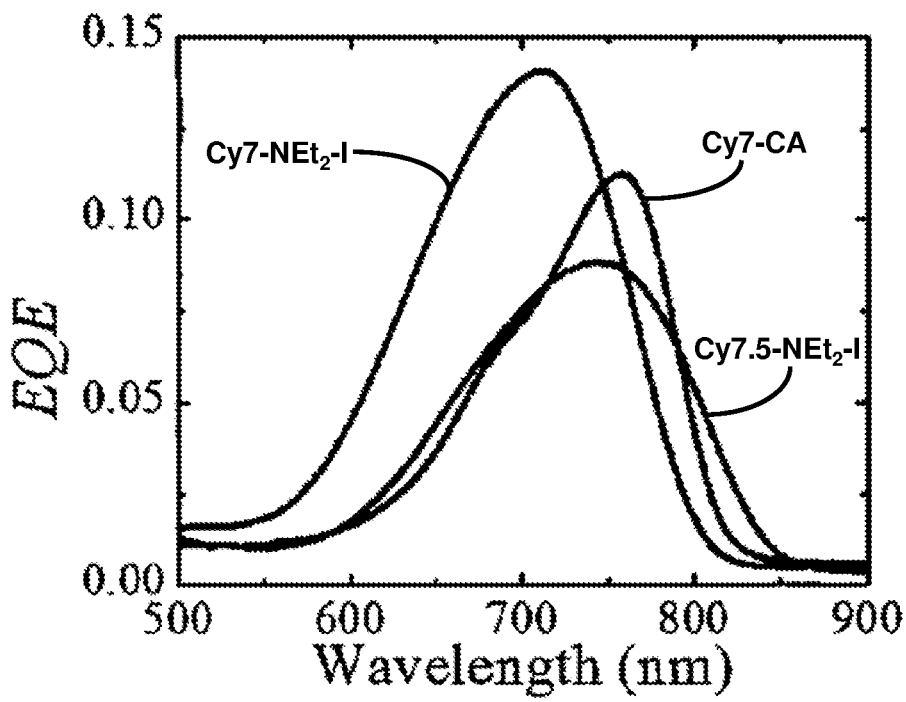
FIG. 7B shows representative external quantum efficiency (EQE) of three cyanine dye TLSC systems as a function wavelength, measured at distance d=5 mm.

The TLSC devices are formed on borosilicate glass plates with an active area of 25.8 cm$^2$. FIG. 5A is a schematic showing a transparent luminescent solar concentrator (LSC) that selectively harvests near-infrared (NIR) light and emits deeper NIR while passing visible light and FIG. 5B shows photographs of the TLSCs incorporating Cy7-CA, Cy7-NEt$_2$-I, and Cy7.5-NEt$_2$-I modified luminophores. Cyanine molecules are dissolved in ethanol solutions, mixed with a polymer host, and then drop-cast onto glass sheets to form luminophore/polymer composite films. Laser-cut Si photovoltaic cells are mounted around the two orthogonal edges and connected in parallel. The photovoltaic performance of the TLSCs based on the three cyanine dyes is shown in FIG. 7A. The short-circuit current density ($J_{sc}$) of the device with Cy7-NEt$_2$-I is 1.18 mAcm$^{-2}$, with an open-circuit voltage ($V_{oc}$) of 0.51 V, and a fill factor (FF %) of 60%, leading to an efficiency of 0.36%. This is close to prior work utilizing 1-(6-(2,5-dioxopyrrolidin-1-yloxy)-6-oxohexyl)-3,3-dimethyl-2-((E)-2-((E)-3-((E)-2-(1,3,3 trimethylindolin-2-ylidene)ethylidene)cyclohex-1-enyl)vinyl)-3H-indolium chloride (Cy7-NHS) with an active area of only 4 cm$^2$. The J-V characteristic of TLSC with Cy7-CA is also measured, which shows a $J_{sc}$ of 0.93 mAcm$^{-2}$, with a $V_{oc}$ of 0.49 V, and FF % of 61%, resulting in a PCE of 0.28%, which is lower than previously reported Cy7 devices due to the 6-times larger device area. The second cyanine luminophore derivative Cy7.5-NEt$_2$-I has similar Vo of 0.48 V, and FF % of 57% with lower $J_{sc}$ of 1.02 mAcm$^{-2}$, and an overall efficiency of 0.28%, which is similar to the Cy7-CA control TLSC device. FIG. 7B shows the external quantum efficiency (EQE) spectra of the three cyanine luminophores. The peak positions of Cy7-CA, Cy7-NEt$_2$-I, and Cy7.5-NEt$_2$-I match the absorption spectra in FIGS. 5C-5E and no direct excitation of the edge mounted solar cells is observed. In the emission wavelength range of these three cyanine dyes (700 to 850 nm), the edge-mounted Si PV show a nearly constant EQE (~90%). While Cy7-NEt$_2$-I with the highest QY in the polymer film leads to the highest EQE peak of 14.1% at 710 nm, the EQE peaks of Cy7-CA and Cy7.5-NEt$_2$-I are 11.3% and 8.8% at 760 nm and 745 nm, respectively. These are also consistent with the QY trend of the three cyanine dyes. The integrated short circuit current density from integrating the product of the position-averaged EQE and the AM1.5G solar spectrum is used to confirm the photocurrent density of the whole TLSC device. For TLSCs with 5.08 cm×5.08 cm active area, five EQE spectra are tested as a function of the distance (d) from the excitation source to edge-mounted PV cell. Based on its wide absorption and high QY, Cy7-NEt$_2$-I yields an integrated $J_{sc}$ of 1.22 mAcm$^{-1}$. The wider absorption peak of Cy7.5-NEt$_2$-I compensates the slightly lower QY in the polymer film, thus exhibiting a close integrated $J_{sc}$ compared with Cy7-CA. All the integrated $J_{sc}$ values are within error of the photocurrent densities from J-V measurement. To check the validity of the EQE, transmission (T(λ)), and reflection (R(λ)) spectra measurements of these devices, it is shown that EQE(λ)+R(λ)+T(λ) less than or equal to 1 is satisfied at each wavelength. This validity check is plotted in FIGS. 4A-4C for each device.

To explore the impact of Stokes shift on the scalability, TLSC systems are characterized by the external quantum efficiency as a function of position. Multiple EQE scans were taken for each TLSC system as d was increased from 15 mm to 95 mm (10 mm interval, and the same Si PV strip is used for all the EQE scans). The normalized EQE spectra of three cyanine dyes is plotted in FIG. 8A-8C. The EQE peak values of each individual scan of the three cyanine dyes is extracted and plotted in FIG. 8D.

The overall power conversion efficiency of a LSC or TLSC system is the product of the component efficiencies:

$$\eta_{LSC} = \eta_{Opt} \cdot \eta^*_{PV} = (1-R_f) \cdot \eta_{Abs} \cdot \eta_{PL} \cdot \eta_{Trap} \cdot \eta_{RA} \cdot \eta^*_{PV} \quad (1),$$

where $R_f$ is the front surface reflection, $\eta_{Abs}$ is the solar spectrum absorption efficiency of the luminophore, $\eta_{PL}$ is the luminescence efficiency of the luminophore, $\eta_{Trap}$ is the photon trapping (or waveguiding) efficiency, $\eta^*_{PV}$ is the efficiency of the edge-mounted PV cell normalized by its solar spectrum absorption efficiency and EQE at the luminophore wavelength to account for photon downshifting and $\eta_{RA}$ is the efficiency of suppressing reabsorption. The optical efficiency is predominantly limited by reabsorption loss either by the waveguide or the luminophore itself.

The higher degree of conjugation with Cy7.5-NEt$_2$-I results in a lower bandgap. Therefore, both the absorption and emission spectra of Cy7.5-NEt$_2$-I are red-shifted compared to Cy7-NEt$_2$-I, and the shape of both spectra remain nearly identical. That the absorption spectrum of Cy7-NEt$_2$-I is blue-shifted relative to Cy7-CA can be understood via the Dewar-Knott color rule. Addition of an electron donating species to the central position of the polymethine chain destabilizes the LUMO, which has significant density on the central carbon as shown in FIGS. 6A-6C, while leaving the energy of the HOMO, which has little density on that carbon, unaffected. When the amine is oriented such that its lone pair electron is conjugated with the polymethine chain, it acts as such an electron donating group, therefore the excitation energy is increased.

The nuclear relaxation responsible for the enhanced Stokes shift of Cy7-NEt$_2$-I and Cy7.5-NEt$_2$-I compared to Cy7-CA is investigated via linear response time-dependent density functional theory calculations. The computed Stokes shifts (0.07, 0.15, and 0.17 eV for truncated models of Cy7-CA, Cy7-NEt$_2$-I, and Cy7.5-NEt$_2$-I, respectively) are in good agreement with the experimental values (0.06, 0.19, and 0.17 eV in solution). The polymethine chains of all three molecules relax similarly in the excited state, with individual bond lengths changing by up to 0.02 Å. Additional relaxation is observed in the central amino groups of Cy7-NEt$_2$-I and Cy7.5-NEt$_2$-I. The bond lengths between the central carbon of the polymethine chain and the amine nitrogen are lengthened by 0.02 Å, consistent with excitation into a LUMO that is antibonding with respect to the amine bond as shown in FIGS. 6A-6C. The amino group also twists relative to the polymethine chain upon excitation, with the torsion angles increasing from 44° to 55° in Cy7-NEt$_2$-I and from 44° to 56° in Cy7.5-NEt$_2$-I. This torsional motion reduces the conjugation of the lone pair on the nitrogen atom of the amino group to the π orbitals of the polymethine chain, thus decreasing the electron donating ability of the group. Together, these twisting and stretching motions destabilize the LUMO but leave the energy of the HOMO—which does not have density on the amine bond—relatively unaffected. These changes in orbital energy account for the enhanced Stokes shifts of Cy7-NEt$_2$-I and Cy7.5-NEt$_2$-I compared to Cy7-CA.

The main factor that leads to enhanced performance for the TLSC with Cy7-NEt$_2$-I is the increased $J_{SC}$ as shown in Table 6. Several key factors are responsible for these changes: changes in quantum yield, variations in total absorption (absorption width), and reductions in reabsorption loss. Surprisingly, the Cy7-NEt$_2$-I with a large Stokes shift of 70 nm in the polymer film only shows slightly better reabsorption efficiency compared to Cy7-CA with a small Stoke shift of 26 nm, and Cy7.5-NEt$_2$-I shows even more rapid EQE peak decay than the other two. To understand this surprising result, it is important to recall that the EQE of TLSC consists of the optical efficiency, $\eta_{Opt}$ (the number of photons reaching the waveguide/number of photons incident on the waveguide active area) and the EQE of the PV at the emission wavelength. A numerical calculation of optical efficiency is performed by accounting for multiple reabsorption and emission events. Excellent agreement of the experimental EQE and the simulated optical efficiency suggests that reabsorption is indeed the main loss mechanism in all of these TLSC systems and that despite the large increase in the SS, the scalability is not significantly improved. Considering the other factors contributing to the photocurrent, it is primarily the increased absorption width and quantum yield that leads to the $J_{SC}$ increase.

between Cy7-CA and Cy7.5-NEt$_2$-I, there is only a small difference in the OI. This is because the absorption tail is broadened with the increase in the SS. Peak broadening is often observed with red-shifted chromophores, resulting from increased vibrational states and/or larger conformational flexibility and more potential isomeric states. Furthermore, a potential charge transfer process can also lead to spectral broadening, if a strong dipole is induced upon excitation. The similarity of the OI elucidates the similar optical efficiency (or EQE decay curves) in FIG. 8D and show the correct correlation: increasing the OI leads to improved scalability in the EQE, while the measured SS shows no trend. Thus, the OI more sensitively captures and reflects the distance dependence of luminophores with differing Stokes shifts. The way the OI is defined in Equation 2, it is useful not only for organic dyes but all luminophores (including inorganic quantum dots) and all luminophore optical densities. For screening purposes, the OI can be evaluated for fixed absolute absorption values (e.g., A=80%). It is thus a useful design parameter for quickly tracking, predicting, and understanding relative performance changes in a range of LSC systems. It is natural to consider the FRET overlap integral (J) as a parameter to correlate the EQE scalability as it is material specific. Conceptually, however, J depends on both the shape and the magnitude of molar absorptivity coefficient (ε) and therefore can predict the wrong scaling. For example, if the magnitude of ε is lower for the same spectral shape, one would simply load more luminophore to maintain the same optical density (absolute absorption) leading to the same OI. Indeed, it is shown that J does not correlate with the scaling of the EQE with d. The measured trends, from lowest to highest scaling are: Cy7.5-NEt$_2$-I, Cy7-CA, Cy7-NEt$_2$-I; J predicts Cy7-

TABLE 6

Summary of photovoltaic parameters and overlap integrals of TLSC systems with different cyanine luminophores and Cy7-NHS.

| | Area (cm$^2$) | Jsc (mAcm$^{-2}$) | Int. Jsc (mAcm$^{-2}$) | Voc (V) | FF (%) | PCE (%) | AVT (%) | J (μm$^3$M$^{-1}$) | OI |
|---|---|---|---|---|---|---|---|---|---|
| Cy7-NHS | 4 | 1.20 | 1.00 | 0.50 | 66 | 0.40 | 88.0 | 1.49 | 27.9 |
| Cy7-CA | 25.8 | 0.93 | 0.96 | 0.49 | 61 | 0.28 | 88.1 | 1.56 | 27.2 |
| Cy7-NEt$_2$-I | 25.8 | 1.18 | 1.22 | 0.51 | 60 | 0.36 | 77.1 | 0.46 | 25.9 |
| Cy7.5-NEt$_2$-I | 25.8 | 1.02 | 0.82 | 0.48 | 57 | 0.28 | 84.7 | 0.99 | 30.8 |

Both the experimental and modeling results suggest that Stokes shift is not ultimately a useful design parameter to identify how well a luminophore will perform in LSCs over a large area. Thus, here, a new parameter is defined—the overlap integral (OI) to quantify the reabsorption properties of a luminophore as:

$$OI = \int_0^\infty A(\lambda) \cdot PL^*(\lambda) d\lambda, \quad (2)$$

where $A(\lambda)$ is the single-path absolute absorption spectrum $(A(\lambda)-1-R(\lambda)-T((\lambda)))$ of a luminophore/host composite film, and $PL^*(\lambda)d\lambda$ is the normalized emission spectrum of the luminophore in the host material. The OI then depends on the thickness of the luminophore layer and the degree of overlap between the absorption and emission spectra in the host material (rather than in solution). The calculated OI for the investigated luminophores is summarized in Table 6. Despite the large SS between Cy7-CA and Cy7-NEt$_2$-I and CA, Cy7.5-NEt$_2$-I, Cy7-NEt$_2$-I, while the OI correctly captures the trend Cy7.5-NEt$_2$-I, Cy7-CA, Cy7-NEt$_2$-I.

Given that the absorption coefficient in the NIR range for the host polymer material and targeted glass is in the range from $10^{-2}$ to $10^{-4}$ cm$^{-1}$ (e.g., poly(methyl methacrylate)s and certain glasses), most reabsorption losses stems from the luminophore. To qualitatively connect the trends in the OI with the quantum efficiency roll-off behavior, an additional simulation is performed where the absolute absorption spectrum of a sample LSC is kept fixed and the normalized emission is manually shifted to create different overlap in the modeling as shown in FIG. 9A. While such a manual shifting of the emission corresponds to increases in the Stokes shift and creates different OI values, such an increase in the Stokes shift in practice does not necessarily lead to changes in the OI due to variations in the peak bandwidth. The calculated optical efficiency in FIG. 9B shows the impact of overlap integral on the TLSC scalability: if the OI can be decreased from 30 to 3 (i.e., an order of magnitude), the critical TLSC plate length (L) (defined as the distance at which the optical decays to half of its original value) can be increased from 2 cm to greater than 1 m, which would be sufficient for many large-scale and window-based applications. There is also a tradeoff between absorption efficiency and the OI on the total power conversion efficiency that also depends on the thickness (which dictates the optical density of the luminophore). In the case of the TLSCs, the impact on the average visible transparency (AVT) and color rendering index (CRI) should also be considered, emphasizing that broad absorption in the invisible solar spectrum with sharp absorption cutoffs around the visible and near the bandgap are also key. Thus, strategies for sharpening the densities of states around the bandgap should be explored moving forward. The most feasible approach to minimize OI is to modify the NIR selective harvesting luminophore, so that both the absorption edges have sharp cutoffs, keeping the emission narrow as well. Adding more fused rings to lock the geometry of the cyanine dyes could potentially restrict the distribution of conformers at the ground state, and thus achieve sharper transition bandwidths. Furthermore, the restricted geometry (molecular rigidity) could lead to increased quantum efficiency by reducing non-radiative decay pathways.

It is also important to consider the impact of increasing the OI by simply increasing the Stokes shift. The ideal Stokes shift should not only be engineered to minimize the OI, but also carefully adjusted to allow all the emission of the luminophores to coincide with the high EQE wavelength range of the edge-mounted PV cells. If the SS is too large, a portion of the emission will have a wavelength longer than the absorption cut-off of the edge-mounted PVs and thus cannot be harvested. For example, with edge mounted Si PVs the maximum Stokes shift should be limited to less than 200 nm with the selective harvesting of a 200-300 nm slice of the NIR spectrum for optimal performance. For GaAs PVs with wider band gap, the maximum Stokes shift should be even more restricted.

FIG. 10 shows an increase in SS that results from modifying the central methine group of a cyanine dye. The modified cyanine dye is suitable for TLSCs.

In conclusion, novel NIR selective harvesting cyanine dyes with large Stokes shift greater than 80 nm and improved quantum yield of greater than 30% are shown. Luminescent solar concentrators based on these cyanine dyes exhibit power conversion efficiency of 0.4% combined with high visible transparency greater than 80% and over 6-times larger areas than demonstrated previously. Based on the analysis of both experiment and simulation results, it is shown that the Stokes shift is not a suitable design parameter to quantify the reabsorption loss moving forward. Instead, a new parameter is defined, the spectral "overlap integral", derived in a way to accurately capture the properties of the overlap between absorption and emission of a luminophore in future LSC design and optimization. Simulations also indicate that with one order of magnitude decrease of the overlap integral, the LSC plate size can be increased to ~1 m, which is sufficient for most structural glazing systems. Thus, these findings provide a guide to improve the efficiency and scalability of NIR-selective harvesting TLSC systems (and all LSCs) that help fulfil the promise of low cost transparent solar cells.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A luminescent solar concentrator device comprising:
a waveguide including,
a luminophore in an active region of the waveguide, having a polymethine component, the polymethine component comprising a plurality of methine groups (=CH—)

where n is an odd integer greater than 1 and a hydrogen atom (H) of one of the plurality of methine groups is replaced by one of

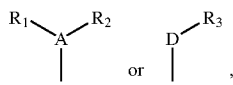

where:
A is selected from nitrogen (N), phosphorus (P), arsenic (As) and antimony (Sb) and D is selected from oxygen (O), sulfur(S), selenium (Se), and tellurium (Te),
$R_1$ and $R_2$ are independently selected from H, aromatic groups, aliphatic groups bound to A through a carbon atom, or $R_1$ and $R_2$ together form an alicyclic ring containing A, and
$R_3$ is selected from H, aliphatic groups, aromatic groups, and alicyclic groups bound to D through a carbon atom,
wherein the luminophore has an overlap integral (OI) of less than or equal to about 20, and an absolute absorption of greater than or equal to about 50% in absorption spectra, wherein the OI is defined by formula (2):

$$OI = \int_0^\infty A(\lambda) \cdot PL^*(\lambda) d\lambda, \tag{2}$$

where $A(\lambda)$ is a single-path absolute absorption spectrum of a composite film comprising a luminophore and a host material, and $PL^*(\lambda)$ is a normalized emission spectrum of the luminophore in the host material,
wherein the active region of the waveguide includes a front surface and a back surface, the front surface and the back surface being outermost surfaces of the luminescent solar concentrator device, and
wherein the luminescent solar concentrator device is visibly transparent and has a quantum yield of greater than or equal to about 20%.

2. The luminescent solar concentrator device according to claim 1, wherein:
$R_1$ and $R_2$ are individually selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, or substituted or unsubstituted $C_1$-$C_{20}$ aminoalkyl, or $R_1$ and $R_2$ together form a substituted or unsubstituted $C_1$-$C_{20}$ cycloalkyl, or substituted or unsubstituted $C_1$-$C_{20}$ heteroalkyl.

3. The luminescent solar concentrator device according to claim 2, wherein the A is nitrogen (N).

4. The luminescent solar concentrator device according to claim 1, wherein $R_3$ is selected from H, substituted or unsubstituted $C_1$-$C_{20}$ alkyl, substituted or unsubstituted $C_1$-$C_{20}$ alkenyl, substituted or unsubstituted $C_1$-$C_{20}$ acyl, substituted or unsubstituted $C_1$-$C_{20}$ ether or polyether, substituted or unsubstituted $C_1$-$C_{20}$ hydroxyalkyl, or substituted or unsubstituted $C_1$-$C_{20}$ aminoalkyl.

5. The luminescent solar concentrator device according to claim 4, wherein the D is oxygen (O).

6. The luminescent solar concentrator device according to claim 1, wherein a central methine group is the one of the plurality of methine groups having the hydrogen atom (H) replaced by the

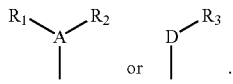

7. The luminescent solar concentrator device according to claim 1, wherein the luminophore has an OI of less than or equal to about 3.4.

8. The luminescent solar concentrator device according to claim 1, wherein the luminophore has a Stokes shift of greater than or equal to about 50-75 nm to less than or equal to about 225 nm.

9. The luminescent solar concentrator device according to claim 1, wherein the luminophore has a strongest absorbance maximum of light at a wavelength of greater than or equal to about 400 nm.

10. The luminescent solar concentrator device according to claim 1, wherein the luminophore has a strongest peak absorbance of light at a wavelength of greater than or equal to about 650 nm.

11. The luminescent solar concentrator device according to claim 1, wherein the luminophore has a strongest peak absorbance of light at a wavelength of less than or equal to about 450 nm.

12. The luminescent solar concentrator device according to claim 1, wherein the luminophore has a strongest peak emission of light at a wavelength of greater than or equal to about 650 nm.

13. The luminescent solar concentrator device according to claim 1, wherein the luminophore has a strongest peak absorbance of light at a wavelength of greater than or equal to about 650 nm and a strongest peak emission of light at a wavelength of greater than or equal to about 650 nm.

14. The luminescent solar concentrator device according to claim 1, wherein the luminescent solar concentrator device has an average visible transmittance of greater than or equal to about 80% 75%.

15. The luminescent solar concentrator device according to claim 1, wherein the luminescent solar concentrator device has an external quantum efficiency of greater than or equal to about 7%.

16. The luminescent solar concentrator device according to claim 1, wherein the luminescent solar concentrator device has an average visible transmittance of greater than or equal to about 90%.

17. The luminescent solar concentrator device according to claim 1, wherein the luminophore also has a Stokes shift of greater than or equal to about 50 nm to less than or equal to about 250 nm.

18. The luminescent solar concentrator device according to claim 1, wherein the organic luminophore is fluorescent.

* * * * *